(12) United States Patent
Wang et al.

(10) Patent No.: US 11,778,883 B2
(45) Date of Patent: Oct. 3, 2023

(54) DISPLAY DEVICE, MANUFACTURE METHOD, AND ELECTRONIC EQUIPMENT

(71) Applicant: BOE TECHNOLOGY GROUP CO., LTD., Beijing (CN)

(72) Inventors: Qing Wang, Beijing (CN); Kuanta Huang, Beijing (CN); Xiaochuan Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 204 days.

(21) Appl. No.: 16/959,298

(22) PCT Filed: Aug. 27, 2019

(86) PCT No.: PCT/CN2019/102821
§ 371 (c)(1),
(2) Date: Jun. 30, 2020

(87) PCT Pub. No.: WO2021/035531
PCT Pub. Date: Mar. 4, 2021

(65) Prior Publication Data
US 2021/0399056 A1 Dec. 23, 2021

(51) Int. Cl.
*H10K 59/38* (2023.01)
*H10K 50/85* (2023.01)
(Continued)

(52) U.S. Cl.
CPC ........... *H10K 59/38* (2023.02); *H10K 50/844* (2023.02); *H10K 50/85* (2023.02); *H10K 50/865* (2023.02);
(Continued)

(58) Field of Classification Search
CPC ............... H01L 27/322; H01L 27/3279; H01L 2227/323; G09G 3/3258;
(Continued)

(56) References Cited

U.S. PATENT DOCUMENTS 10,367,035 B2   7/2019  Ota
10,826,022 B2 * 11/2020  Suzuki ................ H01L 51/5271
(Continued)

FOREIGN PATENT DOCUMENTS

CN   105957878 A   9/2016
CN   109244260 A   1/2019

OTHER PUBLICATIONS

Extended European Search Report dated Aug. 1, 2022; Appln. No. 19932270.2.

*Primary Examiner* — Shaun M Campbell

(57) ABSTRACT

A display device, an electronic equipment, and a manufacture method for manufacturing the display device are provided. The display device includes: a substrate, a plurality of light-emitting elements arranged in an array, the plurality of light-emitting elements including a first light-emitting element and a second light-emitting element; and a color filter layer. In a second direction perpendicular to the surface of the substrate, a distance between the plurality of light-emitting elements and the color filter layer is a first distance; the display device has a color deviation prevention viewing angle on a reference plane determined by the first direction and the second direction perpendicular to the surface of the substrate; the color deviation prevention viewing angle is, an angle between a connection line and the second direction; and the first distance is configured to enable the color deviation prevention viewing angle to be greater than a preset angle.

14 Claims, 9 Drawing Sheets

(51) Int. Cl.
*H10K 50/844* (2023.01)
*H10K 50/86* (2023.01)
*H10K 59/131* (2023.01)
*H10K 71/00* (2023.01)
*H10K 59/12* (2023.01)
*G09G 3/3258* (2016.01)

(52) U.S. Cl.
CPC ......... *H10K 59/1315* (2023.02); *H10K 71/00* (2023.02); *G09G 3/3258* (2013.01); *G09G 2300/0426* (2013.01); *G09G 2300/0819* (2013.01); *G09G 2310/061* (2013.01); *G09G 2320/0257* (2013.01); *H10K 59/1201* (2023.02)

(58) Field of Classification Search
CPC ... G09G 2300/0426; G09G 2300/0829; G09G 2310/061; G09G 2320/0257; H10K 59/38; H10K 59/1315; H10K 59/1201; H10K 71/00; H10K 50/865; H10K 50/85; H10K 50/844
See application file for complete search history.

(56) References Cited

U.S. PATENT DOCUMENTS

| | | | |
|---|---|---|---|
| 2006/0043888 A1* | 3/2006 | Nakagawa | H01L 51/5281 313/506 |
| 2014/0332759 A1* | 11/2014 | Meinhold | H01L 31/0224 257/431 |
| 2015/0155346 A1* | 6/2015 | Motoyama | H01L 27/3218 257/89 |
| 2017/0315372 A1* | 11/2017 | Bang | H01L 27/326 |
| 2018/0138376 A1* | 5/2018 | Koshihara | H01L 51/5265 |
| 2018/0301515 A1 | 10/2018 | Huang | |
| 2019/0043931 A1* | 2/2019 | Yim | H01L 51/5265 |
| 2019/0341438 A1* | 11/2019 | Motoyama | H01L 51/5284 |
| 2020/0243616 A1* | 7/2020 | Boardman | H01L 51/502 |
| 2021/0408453 A1* | 12/2021 | Liu | H01L 27/3244 |
| 2022/0013588 A1* | 1/2022 | Motoyama | H05B 33/12 |

* cited by examiner

DISPLAY DEVICE, MANUFACTURE METHOD, AND ELECTRONIC EQUIPMENT

TECHNICAL FIELD

The embodiments of the present disclosure relate to a display device, an electronic equipment, and a manufacture method for manufacturing the display device.

BACKGROUND

A micro organic light-emitting diode (Micro-OLED) display device is a new type of OLED display device that adopts a silicon substrate as a substrate, and is also called a silicon-based organic light-emitting diode (silicon-based OLED) display device. The silicon-based OLED display device has the advantages of small size and high resolution, and is prepared by a mature CMOS integrated circuit process, and can achieve active addressing of pixels. A variety of functional circuits including a TCON (timing control) circuit, an over current protection (OCP) circuit, etc. can be prepared on a silicon-based substrate, and the silicon-based OLED display device can achieve light weight.

SUMMARY

At least one embodiment of the present disclosure discloses a display device, comprising: a substrate, a plurality of light-emitting elements arranged in an array, and a color filter layer. The substrate comprises a display area and a peripheral area surrounding the display area; the plurality of light-emitting elements arranged in an array is on the substrate, the plurality of light-emitting elements comprise a first light-emitting element and a second light-emitting element adjacent to the first light-emitting element in a first direction parallel to a surface of the substrate; and the color filter layer is on the substrate and comprises a plurality of color filter units, in the display area, the plurality of color filter units are in one-to-one correspondence with the plurality of light-emitting elements and are on a side of the plurality of light-emitting elements away from the substrate; in a direction perpendicular to the substrate, a distance between the plurality of light-emitting elements and the color filter layer is a first distance; the display device has a color deviation prevention viewing angle on a reference plane determined by the first direction and a second direction perpendicular to the surface of the substrate; the color deviation prevention viewing angle is, along a cross-section by the reference plane, an angle between a connection line and the direction perpendicular to the substrate, the connection line connects a side of the first light-emitting element close to the second light-emitting element and a side of a color filter unit, which corresponds to the second light-emitting element, close to the first light-emitting element; and the first distance is configured to enable the color deviation prevention viewing angle to be greater than a preset angle.

For example, the display device provided by at least one embodiment of the present disclosure further comprises a color deviation prevention distance on the reference plane determined by the first direction and the second direction perpendicular to the surface of the substrate, the color deviation prevention distance is, along the cross-section by the reference plane, a minimum distance between an edge of a projection of a light-emitting area of the first light-emitting element on the color filter layer and the color filter unit corresponding to the second light-emitting element.

For example, in the display device provided by at least one embodiment of the present disclosure, the color deviation prevention distance ranges from 0.1 micron to 15 microns.

For example, in the display device provided by at least one embodiment of the present disclosure, the first distance between the plurality of light-emitting elements and the color filter layer ranges from 0.02 microns to 15 microns.

For example, in the display device provided by at least one embodiment of the present disclosure, the preset angle ranges from 30° to 80°.

For example, in the display device provided by at least one embodiment of the present disclosure, the preset angle ranges from 40° to 50°.

For example, in the display device provided by at least one embodiment of the present disclosure, the first distance between the plurality of light-emitting elements and the color filter layer, the color deviation prevention viewing angle, and the color deviation prevention distance satisfy a following relationship:

$$H = D/\tan\theta$$

where H represents the first distance, θ represents the color deviation prevention viewing angle, and D represents the color deviation prevention distance.

For example, in the display device provided by at least one embodiment of the present disclosure, each of the plurality of light-emitting elements comprises: a first electrode layer on the substrate; an organic light-emitting layer, on a side of the first electrode layer away from the substrate; a second electrode layer, on a side of the organic light-emitting layer away from the first electrode layer; the first distance between each of the plurality of light-emitting elements and the color filter layer is a distance between a surface of the second electrode layer away from the substrate and a surface of a corresponding color filter unit of the color filter layer facing the substrate; and the color deviation prevention viewing angle is, along the cross-section by the reference plane, an angle between the connection line and the direction perpendicular to the substrate. the connection line connects a side of the second electrode layer of the first light-emitting element close to the second light-emitting element and the side of the color filter unit, which corresponds to the second light-emitting element, close to the first light-emitting element For example, in the display device provided by at least one embodiment of the present disclosure, each of the plurality of light-emitting elements further comprises: a hole injection layer, a hole transport layer, an electron injection layer, and an electron transport layer. The hole injection layer is between the organic light-emitting layer and the first electrode layer; the hole transport layer is between the hole injection layer and the organic light-emitting layer; the electron injection layer is between the organic light-emitting layer and the second electrode layer; and the electron transport layer is between the electron injection layer and the organic light-emitting layer.

For example, the display device provided by at least one embodiment of the present disclosure further comprises a black matrix between adjacent color filter units of the plurality of color filter units.

For example, in the display device provided by at least one embodiment of the present disclosure, the color deviation prevention distance is equal to a width of the black matrix in the first direction.

For example, in the display device provided by at least one embodiment of the present disclosure, a width of the black matrix in the first direction is equal to a distance between adjacent light-emitting elements in the first direction.

For example, in the display device provided by at least one embodiment of the present disclosure, any two adjacent color filter units partially overlap, and the black matrix is a portion where the any two adjacent color filter units overlap.

For example, in the display device provided by at least one embodiment of the present disclosure, projections of the plurality of color filter units on a plane where the substrate is located are continuous and do not overlap in the first direction.

For example, in the display device provided by at least one embodiment of the present disclosure, the color deviation prevention distance is equal to half of a distance between adjacent light-emitting elements in the first direction.

For example, in the display device provided by at least one embodiment of the present disclosure, the substrate is a silicon-based base substrate, the silicon-based base substrate comprises pixel circuits, and the pixel circuits are connected to first electrode layers of the plurality of light-emitting elements through tungsten materials filled in via holes on the substrate and are configured to drive the first electrode layers of the plurality of light-emitting elements, respectively.

For example, in the display device provided by at least one embodiment of the present disclosure, the plurality of light-emitting elements are configured to emit white light, each light-emitting element comprises a plurality of light-emitting layers stacked in sequence on the substrate, and the plurality of light-emitting layers emit light of different primary colors; or, each light-emitting element comprises a light-emitting layer, and the light-emitting layer is doped with various dopants for emitting light of different primary colors.

For example, the display device provided by at least one embodiment of the present disclosure further comprises: a first thin film encapsulation layer, provided between the plurality of light-emitting elements and the color filter layer; the first distance comprises a thickness of the first thin film encapsulation layer.

For example, in the display device provided by at least one embodiment of the present disclosure, the first distance is equal to the thickness of the first thin film encapsulation layer.

For example, the display device provided by at least one embodiment of the present disclosure further comprises: an optical coupling-output layer, provided between the first thin film encapsulation layer and the plurality of light-emitting elements; the first distance comprises the thickness of the first thin film encapsulation layer and a thickness of the optical coupling-output layer.

For example, in the display device provided by at least one embodiment of the present disclosure, the first distance is equal to a sum of the thickness of the first thin film encapsulation layer and the thickness of the optical coupling-output layer.

For example, the display device provided by at least one embodiment of the present disclosure further comprises: a second thin film encapsulation layer, disposed on a side of the color filter layer away from the substrate.

For example, in the display device provided by at least one embodiment of the present disclosure, the first thin film encapsulation layer comprises: a first inorganic encapsulation layer, on the side of the light-emitting elements away from the substrate; a second inorganic encapsulation layer, on a side of the first inorganic encapsulation layer away from the substrate; and a first organic encapsulation layer, on a side of the second inorganic encapsulation layer away from the substrate. A refractive index of the first inorganic encapsulation layer is greater than a refractive index of the second inorganic encapsulation layer.

For example, in the display device provided by at least one embodiment of the present disclosure, the second thin film encapsulation layer comprises: a second organic encapsulation layer, on the side of the color filter layer away from the substrate; and a third inorganic encapsulation layer, on a side of the second organic encapsulation layer away from the substrate. A refractive index of the first organic encapsulation layer and a refractive index of the second organic encapsulation layer are substantially identical, and the refractive index of the second organic encapsulation layer is greater than a refractive index of the third inorganic encapsulation layer.

For example, in the display device provided by at least one embodiment of the present disclosure, the array comprises a plurality of rows and a plurality of columns, and the first direction is a row direction or a column direction.

At least one embodiment of the present disclosure further provides an electronic equipment, comprising the display device according to any one of the embodiments of the present disclosure.

For example, in the electronic equipment provided by any embodiment of the present disclosure, the display device is a virtual reality device or an augmented reality device.

At least one embodiment of the present disclosure further provides a manufacture method for manufacturing a display device, comprising: providing a substrate; forming a plurality of light-emitting elements arranged in an array on the substrate, the plurality of light-emitting elements comprising a first light-emitting element and a second light-emitting element adjacent to the first light-emitting element in a first direction parallel to a surface of the substrate; forming a color filter layer on a side of the plurality of light-emitting elements away from the substrate, the color filter layer comprising a plurality of color filter units, and the plurality of color filter units being in one-to-one correspondence with the plurality of light-emitting elements; in a direction perpendicular to the substrate, a distance between the plurality of light-emitting elements and the color filter layer is a first distance, the display device has a color deviation prevention viewing angle on a reference plane determined by the first direction and a second direction perpendicular to the surface of the substrate; the color deviation prevention viewing angle is, along a cross-section by the reference plane, an angle between a connection line and the direction perpendicular to the substrate, the connection line connects a side of the first light-emitting element close to the second light-emitting element and a side of a color filter unit, which corresponds to the second light-emitting element, close to the first light-emitting element; and the first distance is configured to enable the color deviation prevention viewing angle to be greater than a preset angle.

For example, in the manufacture method for manufacturing the display device provided by at least one embodiment of the present disclosure, the display device further comprises: a color deviation prevention distance on the reference plane determined by the first direction and the second direction perpendicular to the surface of the substrate, the color deviation prevention distance is, along the cross-section by the reference plane, a minimum distance between an edge of a projection of a light-emitting area of the first light-emitting element on the color filter layer and the color filter unit corresponding to the second light-emitting element.

For example, in the manufacture method for manufacturing the display device provided by at least one embodiment of the present disclosure, the color deviation prevention distance ranges from 0.1 micron to 15 microns.

For example, in the manufacture method for manufacturing the display device provided by at least one embodiment of the present disclosure, the first distance between the plurality of light-emitting elements and the color filter layer ranges from 0.02 microns to 15 microns.

For example, in the manufacture method for manufacturing the display device provided by at least one embodiment of the present disclosure, the preset angle ranges from 30° to 80°.

For example, in the manufacture method for manufacturing the display device provided by at least one embodiment of the present disclosure, the preset angle ranges from 40° to 50°.

For example, in the manufacture method for manufacturing the display device provided by at least one embodiment of the present disclosure, the first distance between the plurality of light-emitting elements and the color filter layer, the color deviation prevention viewing angle, and the color deviation prevention distance satisfy a following relationship:

$$H=D/\tan\theta$$

where H represents the first distance, $\theta$ represents the color deviation prevention viewing angle, and D represents the color deviation prevention distance.

For example, in the manufacture method for manufacturing the display device provided by at least one embodiment of the present disclosure, forming the plurality of light-emitting elements arranged in the array on the substrate comprises: forming a first electrode layer on the substrate; forming a hole injection layer between the first electrode layer and the color filter layer; forming a hole transport layer between the hole injection layer and the color filter layer; forming an organic light-emitting layer between the hole injection layer and the color filter layer; forming an electron transport layer between the organic light-emitting layer and the color filter layer; forming an electron injection layer between the electron transport layer and the color filter layer; and forming a second electrode layer between the electron injection layer and the color filter layer; the first distance between the plurality of light-emitting elements and the color filter layer is a distance between a surface of the second electrode layer away from the substrate and a surface of the color filter layer facing the substrate; and a vertex of the color deviation prevention viewing angle is on the surface of the second electrode layer away from the substrate.

For example, the manufacture method for manufacturing the display device provided by at least one embodiment of the present disclosure further comprises: forming a black matrix between adjacent color filter units; the color deviation prevention distance is equal to a width of the black matrix in the first direction, and the width of the black matrix in the first direction is equal to a distance between adjacent light-emitting elements in the first direction.

For example, in the manufacture method for manufacturing the display device provided by at least one embodiment of the present disclosure, the substrate is a silicon-based base substrate, and the manufacture method further comprises: forming pixel circuits in the silicon-based base substrate, and the pixel circuits being configured to drive the plurality of light-emitting elements, respectively.

For example, the manufacture method for manufacturing the display device provided by at least one embodiment of the present disclosure further comprises: forming a first thin film encapsulation layer between the plurality of light-emitting elements and the color filter layer; forming an optical coupling-output layer between the first thin film encapsulation layer and the plurality of light-emitting elements; and forming a second thin film encapsulation layer on a side of the color filter layer away from the substrate.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1A:
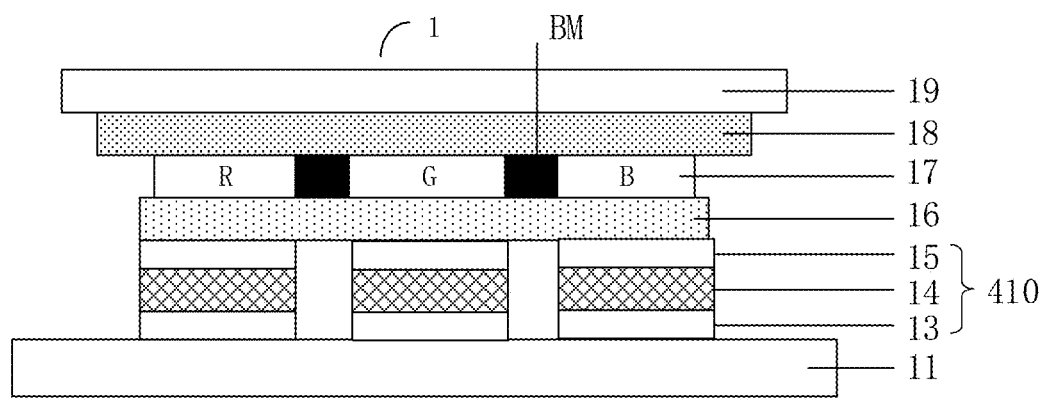
FIG. 1A is a schematic cross-sectional view of a display device provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Because silicon-based OLED display devices have the advantages, such as small size and high resolution, and can achieve ultra-high PPI (an amount of pixels per inch) display and can be used in a relatively wide temperature range, and therefore, the silicon-based OLED display devices are widely used in near-eye display fields, such as virtual reality (VR for short) or augmented reality (AR for short). However, because the silicon-based OLED display device has an ultra-high PPI, in the case of a large viewing angle, color deviation is likely to occur and color mixing occurs, which affects display quality. Therefore, how to solve the color deviation or color mixing under a large viewing angle has become the main problem currently facing.

The inventor also noticed in the research that in the case of designing the display device with high brightness, a 2-tandem structure or a strong microcavity structure is an effective means to increase the brightness of the silicon-based OLED display device, however, because the silicon-based OLED display device needs to achieve ultra-high PPI display, an interval between adjacent pixels in the silicon-based OLED display device is very small, and the strong microcavity structure or the 2-tandem structure will cause relatively serious cross-color problems, which is a problem that needs urgent attention for the silicon-based OLED display devices.

In view of the above problems, at least one embodiment of the present disclosure provides a display device including a substrate, a plurality of light-emitting elements arranged in an array, and a color filter layer. The substrate comprises a display area and a peripheral area surrounding the display area; the plurality of light-emitting elements arranged in an array is on the substrate, the plurality of light-emitting elements comprise a first light-emitting element and a second light-emitting element adjacent to the first light-emitting element in a first direction parallel to a surface of the substrate; and the color filter layer is on the substrate and comprises a plurality of color filter units, in the display area, the plurality of color filter units are in one-to-one correspondence with the plurality of light-emitting elements and are on a side of the plurality of light-emitting elements away from the substrate; in a direction perpendicular to the substrate, a distance between the plurality of light-emitting elements and the color filter layer is a first distance; the display device has a color deviation prevention viewing angle on a reference plane determined by the first direction and a second direction perpendicular to the surface of the substrate; the color deviation prevention viewing angle is, along a cross-section by the reference plane, an angle between a connection line and the direction perpendicular to the substrate, the connection line connects a side of the first light-emitting element close to the second light-emitting element and a side of a color filter unit, which corresponds to the second light-emitting element, close to the first light-emitting element; and the first distance is configured to enable the color deviation prevention viewing angle to be greater than a preset angle.

Some embodiments of the present disclosure also provide an electronic equipment corresponding to the above display device and a manufacture method for manufacturing the display device.

The display device provided by the above embodiments of the present disclosure can avoid the color deviation problem generated under a larger viewing angle while having a high PPI, so that the display quality of the display device can be improved.

The embodiments and examples of the present disclosure will be described in detail below with reference to the drawings.

At least one embodiment of the present disclosure provides a display device. For example, the display device is a silicon-based OLED display device, which can be applied to a virtual reality device or an enhanced display device. Of course, the display device can also be other types of display devices. The embodiments of the present disclosure are not limited to this case.

Figure 2A:
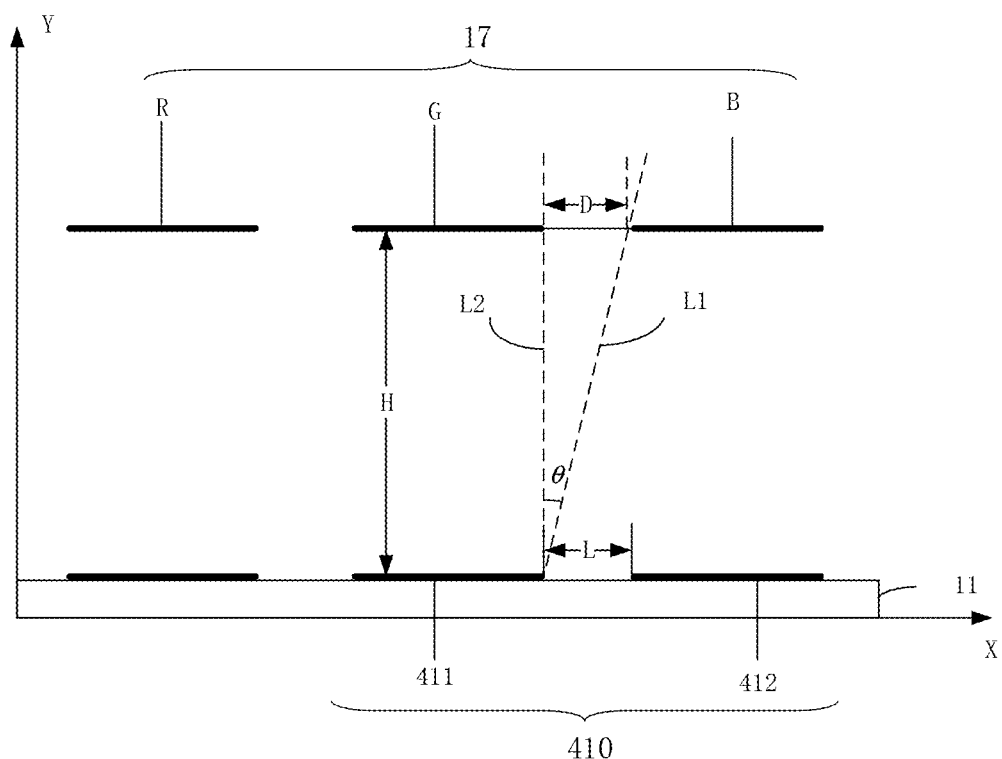
FIG. 2A is a schematic diagram showing a color mixing principle of an example of a display device provided by at least one embodiment of the present disclosure.

FIG. 1A is a schematic cross-sectional view of a display device provided by at least one embodiment of the present disclosure, and FIG. 2A is a schematic diagram showing a color mixing principle of a display device provided by at least one embodiment of the present disclosure. The display device provided by at least one embodiment of the present disclosure will be described in detail below with reference to FIGS. 1A and 2A.

As shown in FIGS. 1A and 2A, the display device 1 includes a substrate 11, a plurality of light-emitting elements 410 arranged in an array, and a color filter layer 17.

For example, the substrate 11 is a silicon-based base substrate, such as a silicon-based base substrate (OLED silicon-based base substrate) used in an organic light-emitting diode (OELD) display device. For example, the substrate 11 functions as support, protection, etc. The substrate 11 may be a single crystal silicon-based base substrate or a silicon-on-insulator (SOI) base substrate. For example, the substrate 11 may further include any suitable components, such as a thin film encapsulation layer, a light extraction layer, and a cover plate, disposed on the substrate 11 to achieve the display function. For example, any suitable circuit components, such as a gate drive circuit, a data drive circuit, and a pixel circuit (not shown in the figure), are integrated on the substrate 11, and these circuit components are prepared by, for example, a silicon semiconductor process (for example, a CMOS process), and the embodiments of the present disclosure are not limited thereto. For example, the pixel circuits are connected to the light-emitting elements by a tungsten material filled in via holes on the substrate, and are configured to respectively drive the plurality of light-emitting elements to emit light, for example, the pixel circuit is connected to a first electrode layer of the light-emitting element, and is configured to drive the first electrode layer of the light-emitting element. For example, the pixel circuit may be a general 2T1C pixel circuit, a general 4T1C pixel circuit, and may also be a pixel circuit having functions, such as internal compensation or external compensation, which is not limited in the embodiments of the present disclosure. For example, the gate drive circuit (not shown) is used to generate a gate drive signal, and the data drive circuit (not shown) is used to generate a data signal. The gate drive circuit and the data drive circuit can adopt circuit structures in the art, and the embodiments of the present disclosure are not limited to this case.

Figure 1B:
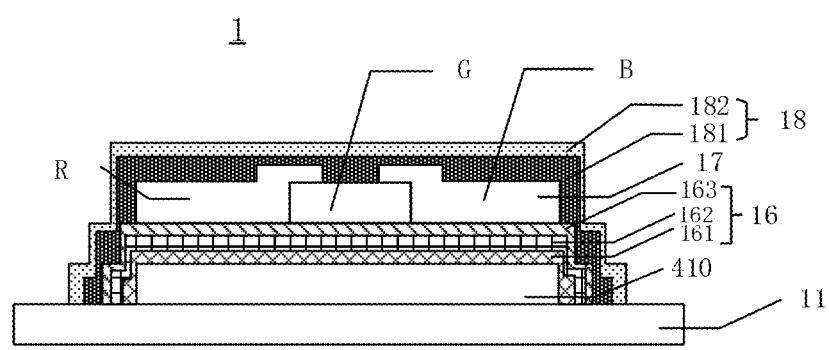
FIG. 1B is a schematic cross-sectional view of another display device provided by at least one embodiment of the present disclosure.
Figure 1C:
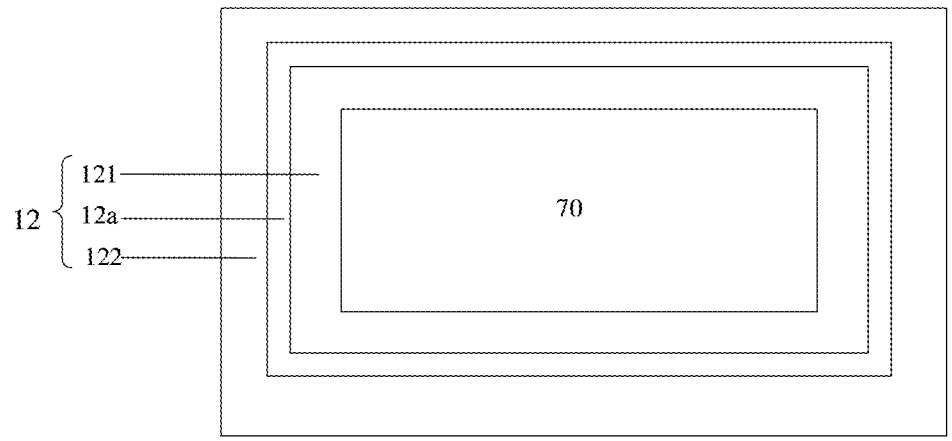
FIG. 1C is a schematic plan view of a display device provided by at least one embodiment of the present disclosure.

For example, as shown in FIG. 1C, the substrate 11 includes a display area 70 and a peripheral area 12 surrounding the display area 70.

For example, as shown in FIG. 1A, the plurality of light-emitting elements 410 arranged in an array are located on the substrate 11. For example, as shown in FIG. 1A, the plurality of light-emitting elements 410 include a first light-emitting element 411 and a second light-emitting element 412 adjacent to the first light-emitting element 411 in a first direction X parallel to a surface of the substrate. For example, the first direction X is a row direction, a column direction, or a diagonal direction, which is not limited in the embodiments of the present disclosure, and the color deviation prevention viewing angles in different reference planes including different first directions may be the same or different. Considering that in the use of the display device, there are many cases where the row direction of the display device is a horizontal direction with respect to the ground, the present disclosure is described by mainly taking the case where the first direction X is the row direction as an example.

For example, as shown in FIG. 1A or FIG. 2A, the color filter layer 17 includes a plurality of color filter units, for example, includes a red color filter unit R, a green color filter unit G, and a blue color filter unit B. For example, in the display area, the plurality of color units are in one-to-one correspondence with the plurality of light-emitting elements 410 and are on a side of the plurality of light-emitting elements 410 away from the substrate 11.

For example, as shown in FIG. 1A, the display device further includes a first thin film encapsulation layer 16, the color filter layer 17 is disposed above the first thin film encapsulation layer 16 and disposed corresponding to the organic light-emitting layer 14, so that the colorized display of the emitted light can be achieved. Of course, the embodiments of the present disclosure are not limited thereto, and the color filter layer 17 may also include color filter units of other colors, such as white, yellow, and the like.

For example, as shown in FIG. 2A, in a direction Y perpendicular to the substrate 11, there is a first distance H between the plurality of light-emitting elements 410 and the color filter layer 17. For example, the display device 1 has a color deviation prevention viewing angle $\theta$ and a color deviation prevention distance D on a reference plane determined by the first direction X and a second direction Y perpendicular to the surface of the substrate 11. For example, the color deviation prevention viewing angle $\theta$ is, along a cross-section by the reference plane determined by the first direction X and the second direction Y, an angle between a connection line L1 and the direction Y (i.e., a straight line L2 shown in FIG. 2A) perpendicular to the substrate, the connection line L connects a side of the first light-emitting element 411 close to the second light-emitting element 412 and a side of a color filter unit B, which corresponds to the second light-emitting element 412, close to the first light-emitting element 411. For example, the color deviation prevention distance D is, along the cross-section by the reference plane, a minimum distance between an edge (for example, an edge of a projection on a green color filter unit G) of a projection of a light-emitting area of the first light-emitting element 411 on the color filter layer and the color filter unit B corresponding to the second light-emitting element 412.

For example, the first distance H is configured to enable the color deviation prevention viewing angle $\theta$ to be greater than a preset angle, so that the problem of color deviation generated under a large viewing angle can be avoided while achieving high PPI, thereby improving the display quality of the display device.

For example, the first distance H between the plurality of light-emitting elements 410 and the color filter layer 17 ranges from 0.02 microns to 15 microns, the color deviation prevention distance D ranges from 0.1 micron to 15 microns, and the preset angle ranges from 30° to 80°. For example, in some examples, the preset angle ranges from 40° to 50°. For another example, the first distance H between the plurality of light-emitting elements 410 and the color filter layer 17 ranges from 0.5 μm to 5 μm, the color deviation prevention distance D ranges from 0.3 microns to 1 micron, and the color deviation prevention viewing angle ranges from 30.96° to 63.4°. For example, in some examples, in the case where the color deviation prevention distance D is determined to be 0.1 μm according to the needs of the aperture ratio and the like, and the color deviation prevention viewing angle is increased to about 78° as needed, the first distance H can be reduced to 0.02 μm, so as to ensure that the display device does not exhibit color mixing under the color deviation prevention viewing angle (for example, if the first distance H is higher than 0.02 μm, the color mixing will occur), thereby achieving the above-mentioned color deviation prevention viewing angle and solving the color mixing problem of the display device under the application of large viewing angle. The embodiments of the present disclosure are not limited to this case.

For example, in at least one embodiment of the present disclosure, as shown in FIG. 2A, the first distance between the plurality of light-emitting elements and the color filter layer, the color deviation prevention viewing angle, and the color deviation prevention distance satisfy the following relationship:

$$H = D/\tan\theta \tag{1}$$

where H represents the first distance, $\theta$ represents the color deviation prevention viewing angle, and D represents the color deviation prevention distance.

For example, after determining the color deviation prevention viewing angle $\theta$ and the color deviation prevention distance D, the first distance H between the plurality of light-emitting elements and the color filter layer can be determined by the above formula (1). Therefore, at the first distance H, the light emitted by the first light-emitting element 411 will not pass through the color filter unit B corresponding to the second light-emitting element 412 under a specific color deviation prevention viewing angle, but only passes through the color filter unit G corresponding to the first light-emitting element 411, that is, under this color deviation prevention viewing angle, the display device 1 displays, for example, only green, but not blue, thereby effectively solving the color deviation problem, avoiding occurring color mixing under the viewing angle, and improving the display quality of the display device. Moreover, under the condition of satisfying a certain aperture ratio, the color deviation prevention viewing angle of the display device can be expanded, and the first distance H corresponding to the expanded color deviation prevention viewing angle can be determined by the above formula (1), which can solve the problem of color deviation that occurs under a specific color deviation prevention viewing angle.

Figure 2B:
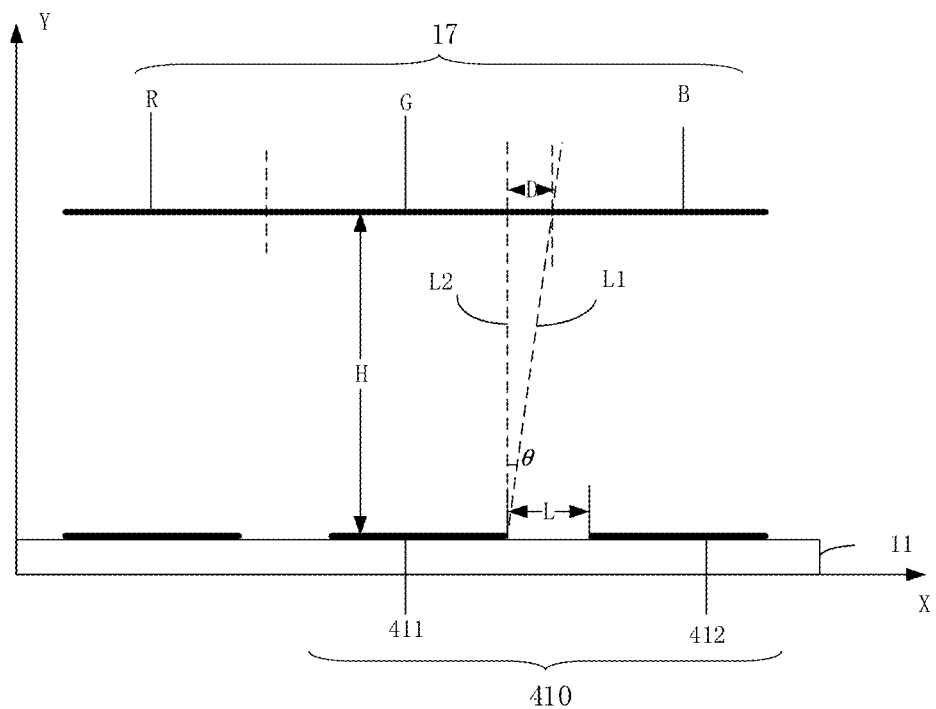
FIG. 2B is a schematic diagram showing a color mixing principle of another example of a display device provided by at least one embodiment of the present disclosure.

For example, in some examples, each of the plurality of light-emitting elements 410 includes a first electrode layer 13, an organic light-emitting layer 14, and a second electrode layer 15. For example, the first electrode layer 13 of the light-emitting element 410 is formed on the substrate 11, the organic light-emitting layer 14 is formed on a side of the first electrode layer 13 of the light-emitting element away from the substrate, and the second electrode layer 15 is formed on a side of the organic light-emitting layer 14 away from the first electrode layer 13. For example, in this example, the first distance H between the plurality of light-emitting elements 410 and the color filter layer 17 is a distance between a surface of the second electrode layer 15 away from the substrate 11 (i.e., an upper surface of the second electrode layer 15) and the surface of the corresponding color filter unit of the color filter layer 17 facing the substrate 11 (i.e., a lower surface of the color filter layer 17). For example, in this example, the color deviation prevention viewing angle is, along the cross-section by the reference plane, an angle between a connection line and the direction perpendicular to the substrate 11, the connection line connects a side of the second electrode layer of the first light-emitting element 411 close to the second light-emitting element 412 and a side of the color filter unit, which corresponds to the second light-emitting element 412, close to the first light-emitting element 411, and a vertex of the color deviation prevention viewing angle is on the surface of the second electrode layer 15 away from the substrate 11 (i.e., the upper surface of the second electrode layer 15). That is, the light-emitting element 420 as shown in FIGS. 2A and 2B is the surface of the second electrode layer 15 away from the substrate 11 (that is, the upper surface of the second electrode layer 15), and the color filter layer 17 as shown in FIGS. 2A and 2B is the surface of the color filter unit of the color filter layer 17 facing the substrate 11 (that is, the lower surface of the color filter layer 17).

For example, the first electrode layer 13 of the light-emitting element is an anode layer, and the second electrode layer 15 of the light-emitting element is a cathode layer, for example, is grounded. For example, the first electrode layer 13 of the light-emitting element may be made of a material including transparent metal oxide, such as indium tin oxide (ITO) or indium zinc oxide (IZO), and has a high light transmittance. For example, the material of the second electrode layer 15 of the light-emitting element is metal. For example, the metal may be made of magnesium, magnesium alloy, aluminum, or aluminum alloy, or the like.

For example, in some examples, the light-emitting element 410 further includes a multilayer structure composed of one or more film layers selected from a group consisting of a hole injection layer 21, an electron injection layer 23, a hole transport layer 22, an electron transport layer 24, an electron blocking layer (not shown), and a hole blocking layer (not shown in the figure). For example, the hole injection layer 21 is disposed between the organic light-emitting layer 14 and the first electrode layer 13; the hole transport layer 22 is disposed between the hole injection layer 21 and the organic light-emitting layer 14; the electron injection layer 23 is disposed between the organic light-emitting layer 14 and the second electrode layer 15; and the electron transport layer 24 is disposed between the electron injection layer 23 and the organic light-emitting layer 14.

Figure 4A:
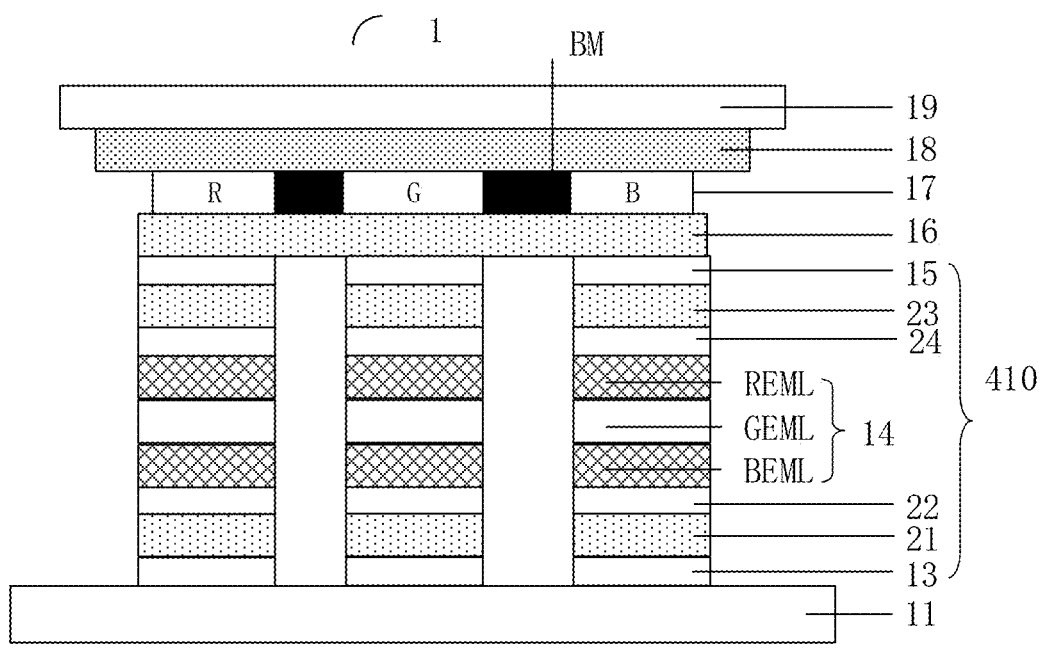
FIG. 4A is a schematic cross-sectional view of yet another display device provided by at least one embodiment of the present disclosure.

For example, the light-emitting element is an OLED light-emitting element. For example, the plurality of light-emitting elements 410 are configured to emit white light. For example, the light-emitting element 410 includes a plurality of light-emitting layers stacked in sequence on the substrate, and the plurality of light-emitting layers emit light of different primary colors; or, the light-emitting element includes a light-emitting layer, and the light-emitting layer is doped with various dopants for emitting light of different primary colors. For example, the organic light-emitting layer 14 may have a single-layer structure or a multilayer structure. For example, in some examples, the organic light-emitting layer 14 may include a plurality of light-emitting layers. For example, white light may be emitted by a light-emitting layer combination including the plurality of light-emitting layers in the organic light-emitting layer 14. For example, as shown in FIG. 4A, the light-emitting layer combination includes three light-emitting layers REML, GEML, and BEML that respectively emit red light, green light, and blue light, and the three light-emitting layers are sequentially stacked with respect to the substrate 11, thereby emitting white light as a whole, alternatively, the light-emitting layer combination includes a light-emitting layer that emits light of one color and a light-emitting layer that emits light of a complementary color to the color, and the two light-emitting layers are sequentially stacked with respect to the substrate 11 so as to emit white light as a whole, the two light-emitting layers include, for example, a light-emitting layer REML that emits red light and a light-emitting layer that emits light of a complementary color of red. The embodiments of the present disclosure are not limited to this case, as long as it can be achieved that white light can be emitted. For example, the organic light-emitting layer 14 may be made of an organic material, and under the voltage driving of the first electrode layer 13 and the second electrode layer 15, the light-emitting characteristics of the organic material are used to emit light according to a required gray scale.

For example, in some examples, as shown in FIGS. 1A and 2A, the display device 1 further includes a black matrix BM disposed between adjacent color filter units. For example, in the example shown in FIG. 2A, the color deviation prevention distance D is equal to a width of the black matrix BM in the first direction X. For example, in this example, the width of the black matrix BM in the first direction X is equal to the distance L between adjacent light-emitting elements in the first direction X, for example, the distance L between the first light-emitting element 411 and the second light-emitting element 412. That is, in this example, the width of the light-emitting element 410 and the width of the color filter unit in the first direction X are equal, and the distance between the light-emitting elements and the distance between the color filter units are equal, that is, the first distance D is equal to the distance L between the respective light-emitting elements. For example, the distance L between the respective light-emitting elements is determined according to the resolution of the display device and the size of the display panel. For a specific determination method, reference may be made to a method in the art, and the specific determination method will not be repeated here. For example, in the case where the resolution is low, the distance L between the light-emitting elements is large, for example, is 15 microns, and in the case where the resolution is high, the distance L between the light-emitting elements is small, for example, 0.1 microns, for example, the distance L between the light-emitting elements can be determined according to the resolution and the size of the display panel, and is not limited by the embodiments of the present disclosure.

For example, in some examples, any two adjacent color filter units partially overlap, and the black matrix is a portion where any two adjacent color filter units overlap. For example, as shown in FIG. 2A, the black matrix is a portion where the red color filter unit R and the blue color filter unit B overlap.

It should be noted that the width of the black matrix BM in the first direction X may not be equal to the distance L between adjacent light-emitting elements in the first direction X, for example, the width of the black matrix BM in the first direction X may be larger or smaller than the distance L between adjacent light-emitting elements in the first direction X, which is not limited in the embodiments of the present disclosure.

In some examples, the display device 1 may not include the black matrix BM disposed between adjacent color filter units. Because the interval between the adjacent color filter units is greater than or equal to the color deviation prevention distance D, a display effect without color deviation can be achieved within a range of the color deviation prevention viewing angle.

For example, in other examples, as shown in FIG. 2B, in the case where the display device does not include a black matrix, and in the case where projections of the plurality of color filter units on the plane where the substrate 11 is located are continuous and do not overlap in the first direction, the color deviation prevention distance D is equal to half of the distance L between adjacent light-emitting elements in the first direction X, that is, L/2, so as to satisfy the color deviation prevention viewing angle.

It should be noted that the color deviation prevention distance D may not be equal to half of the distance L between adjacent light-emitting elements in the first direction X, and may be larger or smaller than half of the distance L between adjacent light-emitting elements in the first direction X, the color deviation prevention distance D may be determined according to the length and position of the light-emitting element and the color deviation prevention viewing angle, and the like, which is not limited by the embodiments of the present disclosure.

For example, in some examples, as shown in FIG. 1A, the display device 1 further includes: a first thin film encapsulation layer 16, an optical coupling-output layer CPU, and a second thin film encapsulation layer 18.

For example, as shown in FIG. 1A, the first thin film encapsulation layer 16 is disposed between the plurality of light-emitting elements 410 and the color filter layer 17, so as to achieve the function of protecting the light-emitting elements and preventing the invasion of water and oxygen in the outside air. For example, in the case where only the first thin film encapsulation layer 16 is included between the plurality of light-emitting elements 410 and the color filter layer 17, the first distance H is a thickness of the first thin film encapsulation layer 16, and thus, the first thin film encapsulation layer 16 can be formed to have different thicknesses to achieve different first distances H.

Figure 4B:
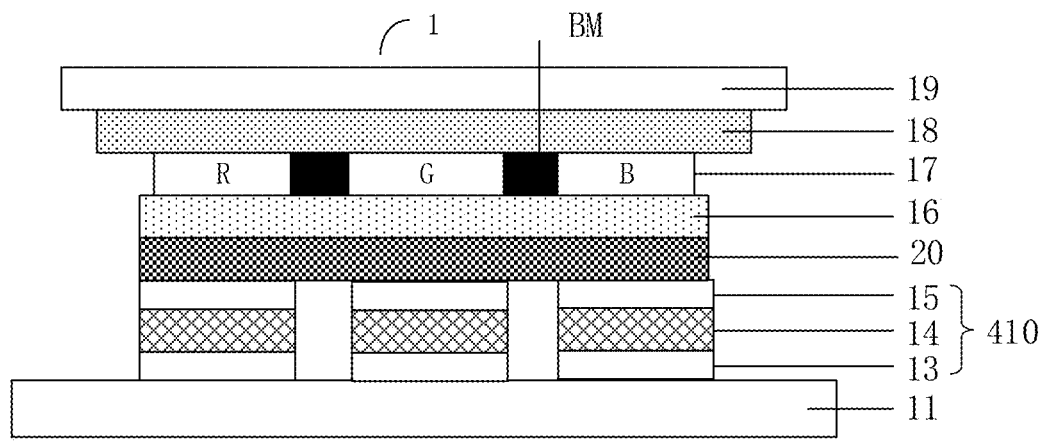
FIG. 4B is a schematic cross-sectional view of still yet another display device provided by at least one embodiment of the present disclosure.

For example, as shown in FIG. 4B, the light coupling-output layer (CPL) 20 is disposed between the first thin film encapsulation layer 16 and the plurality of light-emitting elements 410, that is, a transparent cathode is used to cooperate with the light coupling-output layer to increase the light output. For example, in the case where only the first thin film encapsulation layer 16 and the light coupling-output layer 20 are included between the plurality of light-emitting elements 410 and the color filter layer 17, the first distance H is a sum of the thickness of the first thin film encapsulation layer 16 and the thickness of the light coupling-output layer 20, and thus, the first thin film encapsulation layer 16 and the light coupling-output layer 20 can be formed to have different thicknesses to achieve different first distances H. The embodiments of the present disclosure are not limited to the above situations, in addition to the first thin film encapsulation layer 16 and/or the optical coupling-output layer 20, other intermediate layers may be formed as needed to achieve different first distances H.

For example, the second thin film encapsulation layer 18 is disposed on a side of the color filter layer 17 away from the substrate 11.

For example, in some examples, as shown in FIG. 1A, the display device 1 further includes a cover plate 19, and the cover plate 19 covers the second thin film encapsulation layer 18. For example, the cover plate 19 is disposed opposite to the substrate 10, and the cover plate 19 is attached to the second thin film encapsulation layer 18, for example, to achieve the functions of protection, improving strength, and the like. For example, the cover plate 19 and the substrate 10 are parallel to each other. For example, the material of the cover plate 19 is a transparent material. For example, the transparent material may be an inorganic material, such as glass or an organic material such as polyimide.

For example, in some examples, the cover plate 19 may be made of high-transmittance plain glass, and the embodiments of the present disclosure are not limited thereto.

For example, as shown in FIG. 1A, the second thin film encapsulation layer 18 and the cover plate 19 are sequentially disposed on the color filter layer 17, thereby achieving the function of protecting the color filter layer 17. For example, the first thin film encapsulation layer 16 and the second thin film encapsulation layer 18 are made of a combination of one or more of organic materials or inorganic materials with good sealing characteristics, so as to achieve a good sealing effect and protect the light-emitting element 410. For example, either the first thin film encapsulation layer 16 or the second thin film encapsulation layer 18 may be a composite film layer, and the composite film layer includes one or more organic sub-film layers or inorganic sub-film layers.

For example, as shown in FIG. 1B, in some examples, the first thin film encapsulation layer 16 includes: a first inorganic encapsulation layer 161 on the side of the light-emitting element 410 away from the silicon substrate 11; a second inorganic encapsulation layer 162 on the side of the first inorganic encapsulation layer 161 away from the silicon substrate 11; and a first organic encapsulation layer 163 on the side of the second inorganic encapsulation layer 162 away from the silicon substrate 11. For example, the second thin film encapsulation layer 18 includes: a second organic encapsulation layer 181 on the side of the color filter layer 17 away from the silicon substrate 11; and a third inorganic encapsulation layer 182 on the side of the second organic encapsulation layer 181 away from the silicon substrate 11. A refractive index of the first inorganic encapsulation layer 161 is greater than a refractive index of the second inorganic encapsulation layer 162, the refractive index of the second inorganic encapsulation layer 162, a refractive index of the first organic encapsulation layer 163, and a refractive index of the second organic encapsulation layer 181 are substantially the same, and the refractive index of the second organic encapsulation layer 181 is greater than a refractive index of the third inorganic encapsulation layer 182.

The refractive index of the first inorganic encapsulation layer 161 is greater than the refractive index of the second inorganic encapsulation layer 162, the refractive index of the second inorganic encapsulation layer 162, the refractive index of the first organic encapsulation layer 163, and the refractive index of the second organic encapsulation layer 181 are substantially the same, and the refractive index of the second organic encapsulation layer 181 is greater than the refractive index of the third inorganic encapsulation layer 182.

For example, an absolute value of a difference between the refractive index of the first inorganic encapsulation layer 161 and the refractive index of the second inorganic encapsulation layer 162 or the first organic encapsulation layer 163 may be greater than an absolute value of a difference between the refractive index of the second organic encapsulation layer 181 and the refractive index of the third inorganic encapsulation layer 182. For example, the first inorganic encapsulation layer 161 may be formed of silicon nitride (SiNx) with a refractive index of approximately 1.85, and the second inorganic encapsulation layer 162 may be formed of aluminum oxide with a refractive index of approximately 1.6, and both the first organic encapsulation layer 163 and the second organic encapsulation layer 181 may be formed of Parylene having a refractive index of approximately 1.6, and the third inorganic encapsulation layer 182 may be formed of silicon oxide having a refractive index of approximately 1.5. Therefore, the absolute value of the difference between the refractive index of the first inorganic encapsulation layer 161 and the refractive index of the second inorganic encapsulation layer 162 or the first organic encapsulation layer 163 is 0.25, and is greater than the absolute value, which is 0.1, of the difference between the refractive index of the second organic encapsulation layer 181 and the refractive index of the third inorganic encapsulation layer 182.

For example, the first inorganic encapsulation layer 161 may include silicon nitride, the second inorganic encapsulation layer 162 may include aluminum oxide, the first organic encapsulation layer 163 and the second organic encapsulation layer 181 both include at least one parylene molecule layer, and the third inorganic encapsulation layer 182 includes silicon oxide, however, it should be understood that the embodiments of the present disclosure are not limited thereto.

For example, the thickness of the first inorganic encapsulation layer 161 in the direction perpendicular to the plane of the silicon substrate 11 may be greater than the thickness of the second inorganic encapsulation layer 162 in the direction perpendicular to the plane of the silicon substrate 11. The thickness of the first organic encapsulation layer 163 in the direction perpendicular to the plane of the silicon substrate 11 is greater than the thickness of the first inorganic encapsulation layer 161 in the direction perpendicular to the plane of the silicon substrate 11. The first organic encapsulation layer 163 and the second organic encapsulation layer 181 have substantially the same thickness in the direction perpendicular to the plane of the silicon substrate 11. The thickness of the second organic encapsulation layer 181 in the direction perpendicular to the plane of the silicon substrate 11 is greater than the thickness of the third inorganic encapsulation layer 182 in the direction perpendicular to the plane of the silicon substrate 11. The thickness of the third inorganic encapsulation layer 182 in the direction perpendicular to the plane of the silicon substrate 11 is greater than the thickness of the second inorganic encapsulation layer 162 in the direction perpendicular to the plane of the silicon substrate 11 and is smaller than the thickness of the first inorganic encapsulation layer 161 in the direction perpendicular to the plane of the silicon substrate 11.

In some examples, the first inorganic encapsulation layer 161 may be formed of silicon nitride (SiNx) with a refractive index of about 1.85 to have a thickness of about 2500 angstroms (Å) to 3500 angstroms (Å) in the direction perpendicular to the plane of the silicon substrate 11; the second inorganic encapsulation layer 162 may be formed of aluminum oxide with a refractive index of about 1.6 to have a thickness of about 100 angstroms (Å) to 800 angstroms (Å) in the direction perpendicular to the plane of the silicon substrate 11; each of the first organic encapsulation layer 163 and the second organic encapsulation layer 181 may be formed of parylene with a refractive index of 1.6 to have a thickness of about 4000 angstroms (Å) to 8000 angstroms (Å) in the direction perpendicular to the plane of the silicon substrate 11, and the third inorganic encapsulation layer 182 may be formed of silicon oxide with a refractive index of 1.5 to have a thickness of about 900 Angstroms (Å) to 1500 Angstroms (Å) in the direction perpendicular to the plane of the silicon substrate 11. For example, the first inorganic encapsulation layer 161 may be formed of silicon nitride (SiNx) with a refractive index of about 1.85 to have a thickness of about 3000 Angstroms (Å) in the direction perpendicular to the plane of the silicon substrate 11; the second inorganic encapsulation layer 162 may be formed of aluminum oxide with a refractive index of about 1.6 to have a thickness of about 500 Angstroms (Å) in the direction perpendicular to the plane of the silicon substrate 11; each of the first organic encapsulation layer 163 and the second organic encapsulation layer 181 may be formed of parylene with a refractive index of 1.6 to have a thickness of about 5000 Angstroms (Å) in the direction perpendicular to the plane of the silicon substrate 11, and the third inorganic encapsulation layer 182 may be formed of silicon oxide with a refractive index of 1.5 to have a thickness of about 1000 Angstroms (Å) in the direction perpendicular to the plane of the silicon substrate 11.

The second organic encapsulation layer 181 may be formed of a high-molecular polymer material, the high-molecular polymer material may be, for example, one of the following materials: parylene, acrylic-based resin, methacrylic acid-based resin, polyisoprene, Vinyl resin, epoxy resin, uroalkyl resin, cellulose-based resin, and naphthalene phenyl resin, etc. The thickness of the second organic encapsulating layer 181 can be precisely controlled by adopting the MLD method. The second organic encapsulating layer 181 can include at least one high-molecular polymer molecule layer, the high-molecular polymer is any of the above-mentioned high-molecular polymers. For example, in the case where the first organic encapsulation layer 163 is formed of parylene, the second organic encapsulation layer 181 may include a single parylene molecule layer, two parylene molecule layers, three parylene molecule layers, five parylene molecule layers, ten parylene molecule layers, etc. It should be understood that the high-molecular polymer molecules for forming the second organic encapsulation layer 181 may be the same as or different from the high-molecular polymer molecules for forming the first organic encapsulation layer 163, and the embodiments of the present disclosure are not limited thereto. For example, the first organic encapsulation layer 163 formed of parylene molecules may have a thickness of 100 Angstroms (Å), 500 Angstroms (Å), 1000 Angstroms (Å), 5000 Angstroms (Å), and the like.

Through the MLD method, the thickness of the second organic encapsulation layer 181 can be accurately controlled to achieve Angstrom-level (A) thickness control, thereby, compared with other methods, such as inkjet printing, which usually forms a film layer having a thickness of a few micrometers, reducing the thickness of the encapsulation layer and thus reducing the total device thickness of the display device 1, and increasing the viewing angle of the display device 1.

The third inorganic encapsulation layer 182 may be formed of an inorganic material, the inorganic material may be, for example, at least one selected from a group consisting of aluminum nitride, silicon nitride (SiNx), silicon oxynitride, silicon oxide, aluminum oxide, diamond-like carbon, and the like. The third inorganic encapsulation layer 182 may be formed on a side of the second organic encapsulation layer 181 away from the color filter layer 17 by a method, such as chemical vapor deposition (CVD) (such as plasma enhanced chemical vapor deposition (PECVD)), ion plating, atomic layer deposition (ALD), etc. The third inorganic encapsulation layer 182 may have a better effect of preventing penetration of oxygen and moisture than the second organic encapsulation layer 181. It should be understood that the high-molecular polymer molecules for forming the third inorganic encapsulation layer 182 may be the same as or different from the high-molecular polymer molecules for forming the first inorganic encapsulation layer 161, which is not limited in the embodiments of the present disclosure. For example, the third inorganic encapsulation layer 182 may be formed of silicon oxide, and may have a thickness of 1000 Angstroms (Å).

In some embodiments, the refractive index of the second organic encapsulation layer 181 may be greater than the refractive index of the third inorganic encapsulation layer 182. For example, the second organic encapsulation layer 181 may be formed of parylene with a refractive index of 1.6, and the third inorganic encapsulation layer 182 may be formed of silicon oxide with a refractive index of 1.5.

The color filter layer 17 may include red sub color filter units R, green sub color filter units G, and blue sub color filter units B that are arranged in an array, however, it should be understood that the embodiments of the present disclosure are not limited to this case. For example, the color filter layer 17 is sandwiched between the second thin film encapsulation layer 18 and the first thin film encapsulation layer 16 to release the stress of the second thin film encapsulation layer 18 and the first thin film encapsulation layer 16.

In some embodiments, the refractive index of the first thin film encapsulation layer 16 may be greater than the refractive index of the second thin film encapsulation layer 18, so that the difference between the refractive index of the second thin film encapsulation layer 18 close to the air and the refractive index of the air is small, thereby improving the light exit rate. In an exemplary embodiment, the absolute value of the difference between the refractive index of the first inorganic encapsulation layer 161 and the refractive index of the first organic encapsulation layer 163 is greater than the absolute value of the difference between the refractive index of the second organic encapsulation layer 181 and the refractive index of the third inorganic encapsulation layer 182. For example, the first inorganic encapsulation layer 161 may be formed of silicon nitride (SiNx) with a refractive index of 1.85, the first organic encapsulation layer 163 may be formed of parylene with a refractive index of 1.6, the second organic encapsulation layer 181 may be formed of parylene with a refractive index of 1.6, and the third inorganic encapsulation layer 182 may be formed of silicon oxide with a refractive index of 1.5, therefore, the absolute value of the difference between the refractive index of the first inorganic encapsulation layer 161 and the refractive index of the first organic encapsulation layer 163 is 0.25, and is greater than the absolute value, which is 0.1, of the difference between the refractive index of the second organic encapsulation layer 181 and the refractive index of the third inorganic encapsulation layer 182.

Figure 4C:
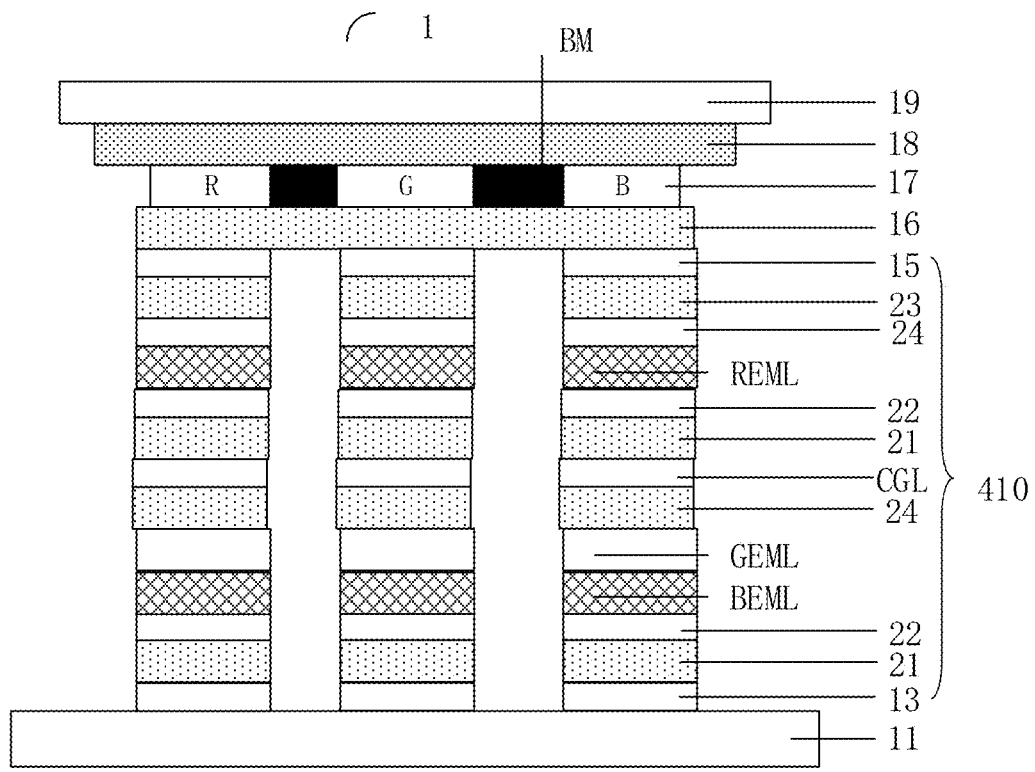
FIG. 4C is a schematic cross-sectional view of yet another display device provided by at least one embodiment of the present disclosure.

FIG. 4C is a schematic cross-sectional view of a display device provided by another embodiment of the present disclosure. As shown in FIG. 4C, the display device 1 includes a hole injection layer 21, a hole transport layer 22, an electron injection layer 23, an electron transport layer 24, and a tandem layer CGL for connecting the above mentioned layers in series, for example, an electron transport layer 24, a tandem layer CGL, a hole injection layer 21, and a hole transport layer 22 are sequentially stacked between the red light-emitting layer REML and the green light-emitting layer GEML, thereby forming the 2tandem structure. For example, in the display device, the first distance (that is, the thickness of the first thin film encapsulation layer 16 as shown in FIG. 4C) between the light-emitting element 410 and the color filter layer 17 is determined by the color mixing principle as shown in FIG. 2A or 2B, it is possible to avoid the occurrence of color mixing under a certain color deviation prevention viewing angle, so that the display device 1 can not only achieve highlight display, but also avoid the color mixing problem caused by the structure.

Figure 1D:
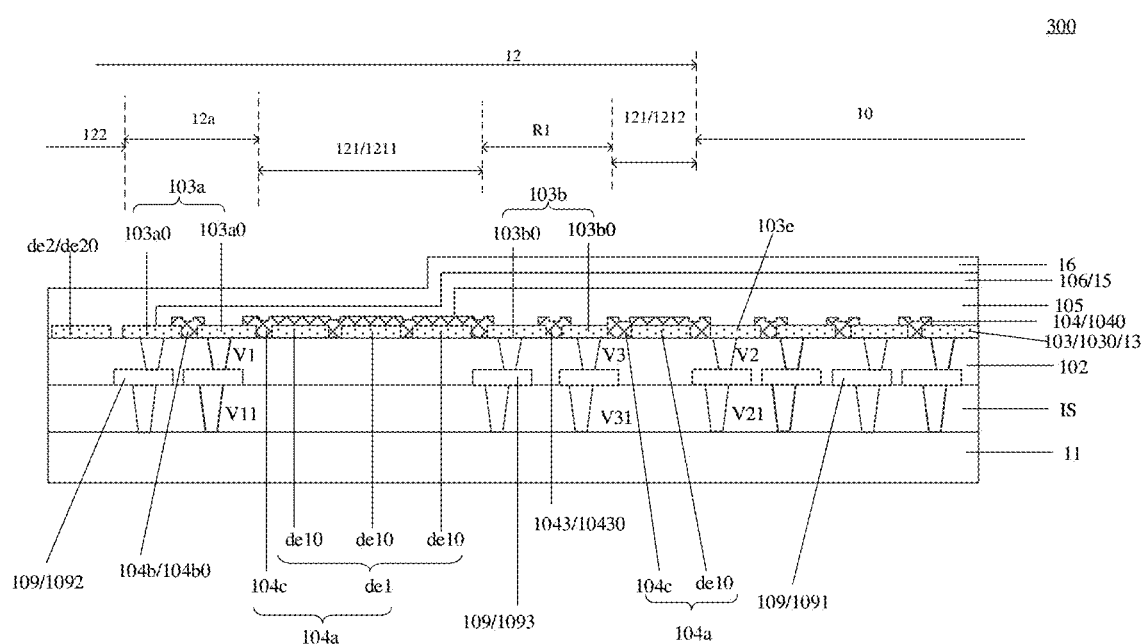
FIG. 1D is a schematic cross-sectional view of yet another display device provided by at least one embodiment of the present disclosure.

For example, FIG. 1D is a schematic partial cross-sectional diagram of a display device provided by an embodiment of the present disclosure. As shown in FIG. 1D, the display device 1 includes: a first electrode pattern 103 located in the display area 70 of the display substrate and including a plurality of first electrodes 1030 (e.g., anodes 13) spaced apart from each other; a connection electrode pattern 103a located in a connection electrode area 12a of the display device and including a plurality of connection electrodes 103a0; and a first dummy electrode pattern de1 located in a first dummy area 121 of the display device and including a plurality of first dummy electrodes de10.

As shown in FIGS. 1C and 1D, the connection electrode area 12a surrounds the display area 70, and the first dummy area 121 is located between the connection electrode area 12a and the display area 70. The connection electrode pattern 103a surrounds the first electrode pattern 103, and the first dummy electrode pattern de1 surrounds the first electrode pattern 103. The first dummy electrode pattern de1 is located between the connection electrode pattern 103a and the first electrode pattern 103.

For example, as shown in FIG. 1D, the display substrate provided by an embodiment of the present disclosure further includes a second electrode 106 (e.g., cathode 15), and the second electrode 106 is connected to the connection electrode 103a0; the peripheral area 12 of the display device surrounds the display area 70, the peripheral area 12 includes the connection electrode area 12a and the first dummy area 121; the second electrodes 106 are located in the display area 70 and the peripheral area 12, and the second electrode 106 and the first electrode pattern 103 are spaced apart from each other.

For example, in the connection electrode area 12a of the display substrate, the projection (not shown) of the color filter layer on the base substrate completely overlaps with the projection of the plurality of connection electrodes 103a0 on the base substrate.

For example, an orthographic projection of the first electrode pattern 103 and an orthographic projection of the second electrode 106 on the substrate 11 are located in the orthographic projection of the color filter layer (not shown) on the substrate 11.

For example, a pattern density of the first electrode pattern 103, a pattern density of the connection electrode pattern 103a, and a pattern density of the first dummy electrode pattern de1 are the same, a pattern shape of the first electrode pattern 103, a pattern shape of the connection electrode pattern 103a, and a pattern shape of the first dummy electrode pattern de1 are all the same, in this way, the consumption rates of the etching solution or the developing solution in the respective areas during etching or development can be approximately the same, so as to ensure the uniformity of the process.

For example, as shown in FIG. 1D, the display device further includes a sensor electrode pattern 103b, the sensor electrode pattern 103b is located in a sensor area R1 of the display substrate and includes a plurality of sensor electrodes 103b. For example, the pattern density of the sensor electrode pattern 103b is the same as the pattern density of the first electrode pattern 103, and the pattern shape of the sensor electrode 103b0 is the same as the pattern shape of the first electrode pattern 103.

It should be noted that the pixel structure of the sensor area R1 is the same as the pixel structure of the display area 70. In the sensor area R1, the sensor electrode 103b0 is electrically connected to the pixel circuit through the tungsten via hole V3 and the via hole V31. The pixel structure of the sensor area R1 is different from the pixel structure of the first dummy sub-area 1211, the pixel structure of the second dummy sub-area 1212, and the pixel structure of the second dummy area 122, the first dummy electrode pattern de1 of the first dummy sub-area 1211, the first dummy electrode de10 of the second dummy sub-area 1212, and the second dummy electrode pattern de2 of the second dummy area 122 are not connected to other circuits through via holes.

For example, the pixel structure of the sensor area R1 is used to sense the voltage of the first electrode 1030 in the display area 70 and is used to implement circuit compensation, for example, a voltage of the first electrode 1030 in the display area 70 may be sensed through a compensation transistor connected to a temperature sensor.

For example, as shown in FIG. 1D, the second dummy sub-area 1212 in the first dummy area 121 is used to isolate the sensor area R1 and the display area 70. The first dummy sub-area 1211 in the first dummy area 121 is used for transition, so that the second electrode 106 and the connection electrode 103a0 in the connection electrode area 12a are better overlapped.

For example, as shown in FIG. 1D, the display substrate further includes a second dummy electrode pattern de2, which is located in the second dummy area 122 of the display substrate and includes a plurality of second dummy electrodes de20; the second dummy area 122 is located on the side of the connection electrode area 12a away from the display area 70. For example, the pattern density of the second dummy electrode pattern de2 and the pattern density of the first electrode pattern 103 are the same, and the second dummy electrode pattern de2 and the first electrode pattern 103 are separated by a pixel defining layer.

For example, virtual pixels in the first dummy sub-area 1211 of the first dummy area 121 and virtual pixels in the second dummy area 122 are located in two rows, respectively. For example, there are two rows in the row direction and two columns in the column direction.

For example, as shown in FIG. 1D, the second dummy sub-area 1212 is located between the sensor area R1 and the display area 70; the portion of the first dummy area 121 between the sensor area R1 and the connection electrode area 12a is the first dummy sub-area 1211; a first filling layer 104a is formed on the first dummy sub-area 1211, the first filling layer 104a includes a plurality of first dummy electrodes de10 and an insulating coating layer 104c, and the first electrode pattern 103 includes an edge first electrode 103e adjacent to the connection electrode 103a0, the insulating coating layer 104c is in contact with the connection electrode 103a0 and the edge first electrode 103e, respectively. For example, the material of the insulating coating layer 104c and the material of the pixel defining layer are the same.

For example, as shown in FIG. 1D, the second electrode 106 is in contact with the insulating coating layer 104c.

For example, as shown in FIG. 1D, a first thin film encapsulation layer 16 is further provided on the side of the second electrode 106 away from the substrate 11, and the first thin film encapsulation layer 16 can prevent water and oxygen from entering the light-emitting functional layer 105.

For example, as shown in FIG. 1D, the edge first electrode 103e is insulated from the plurality of first dummy electrodes de10.

For example, as shown in FIG. 1D, the display substrate further includes a pixel defining layer 104, and the pixel defining layer 104 includes a plurality of pixel defining portions 1040, and each of the plurality of pixel defining portions 1040 is located between adjacent first electrodes 1030.

For example, as shown in FIG. 1D, the insulating coating layer 104c and the pixel defining layer 104 are located in the same layer, and can be formed by using the same patterning process on the same film layer to save the manufacturing process.

For example, as shown in FIG. 1D, the first electrode pattern 103 and the connection electrode pattern 103a are located in the same layer, and can be formed by using the same patterning process on the same film layer to save the manufacturing process.

For example, as shown in FIG. 1D, the display device further includes a second filling layer 104b. The second filling layer 104b includes at least one second filling portion 104b0, and the second filling portion 104b0 is located between adjacent connection electrodes 103a0. For example, the second filling layer 104b is an insulating layer. For example, as shown in FIG. 1D, the second filling portion 104b0 is in contact with the adjacent connection electrodes 103a0, respectively.

For example, as shown in FIG. 1D, the second filling layer 104b and the first filling layer 104a are located in the same layer, and can be formed by using the same patterning process on the same film layer to save the manufacturing process.

For example, as shown in FIG. 1D, the display device further includes a third filling layer 1043, and the third filling layer 1043 includes a plurality of third filling portions 10430, the third filling portion 10430 is located between at least one of the adjacent sensor electrodes 103b0 and the adjacent sensor electrode 103b0 and the first dummy electrode. FIG. 1D takes the case that the third filling portion 10430 is between adjacent sensor electrodes 103b0 as an example.

For example, as shown in FIG. 1D, the third filling layer 1043 and the pixel defining layer 104 are located in the same layer, and can be formed by using the same patterning process on the same film layer, so as to save the manufacturing process.

For example, as shown in FIG. 1D, the display device further includes a light-emitting functional layer 105, the light-emitting functional layer 105 is located between the first electrode pattern 103 and the second electrode 106, and the light-emitting functional layer 105 is in contact with the first filling layer 104a. For example, the light-emitting functional layer 105 is in contact with a part of the first filling layer 104a. For example, in the display area, the color filter layer (not shown) covers the light-emitting functional layer 105. For example, the light-emitting functional layer 105 includes the above-mentioned organic light-emitting layer, a hole injection layer, an electron injection layer, a hole transport layer, an electron transport layer, and the like.

For example, as shown in FIG. 1D, the light-emitting functional layer 105 is in contact with the sensor electrode pattern 103b. The light-emitting functional layer 105 is in contact with the first dummy electrode located in the second dummy sub-area 1212.

As shown in FIG. 1D, an insulating layer IS is further provided on the substrate 11, and a conductive pattern 109 is provided on the insulating layer IS. The conductive pattern 109 includes a first conductive portion 1091, a second conductive portion 1092, and a third conductive portion 1093. The insulating layer IS includes a via hole V11, a via hole V21, and a via hole V31. The via holes V11, V21, and V31 are filled with conductive materials to form connectors. The first electrode 1030 is connected to a connector in the via hole V21 through the first conductive portion 1091. The connection electrode 103a0 is connected to a connector in the via hole V11 through the second conductive portion 1092. The sensor electrode 103b0 is connected to a connector in the via hole V31 through the third conductive portion 1093.

For example, a portion of the first insulating layer 102 that overlaps with the plurality of first dummy electrodes de10 in the direction perpendicular to the base substrate 101 is not provided with via holes.

For example, a portion of the first insulating layer 102 that overlaps with the plurality of second dummy electrodes de20 in the direction perpendicular to the base substrate 101 is not provided with via holes.

For example, a portion of the first insulating layer 102 that overlaps with the plurality of connection electrodes 103a0 in the direction perpendicular to the base substrate 101 is provided with the via hole V1.

For example, a portion of the first insulating layer 102 that overlaps the plurality of first electrodes 1030 in the direction perpendicular to the base substrate 101 is provided with the via hole V2.

For example, a portion of the first insulating layer 102 that overlaps the plurality of sensor electrodes 103b0 in the direction perpendicular to the base substrate 101 is provided with the via hole V3.

For example, FIG. 1D further includes a color filter layer (not shown in the figure) extending to the peripheral area 12. A portion where adjacent color filter units of the color filter layer overlap may form a frame or the peripheral area 12 of the display device. For example, the above formula (1) can be applied to the display area.

Figure 5:
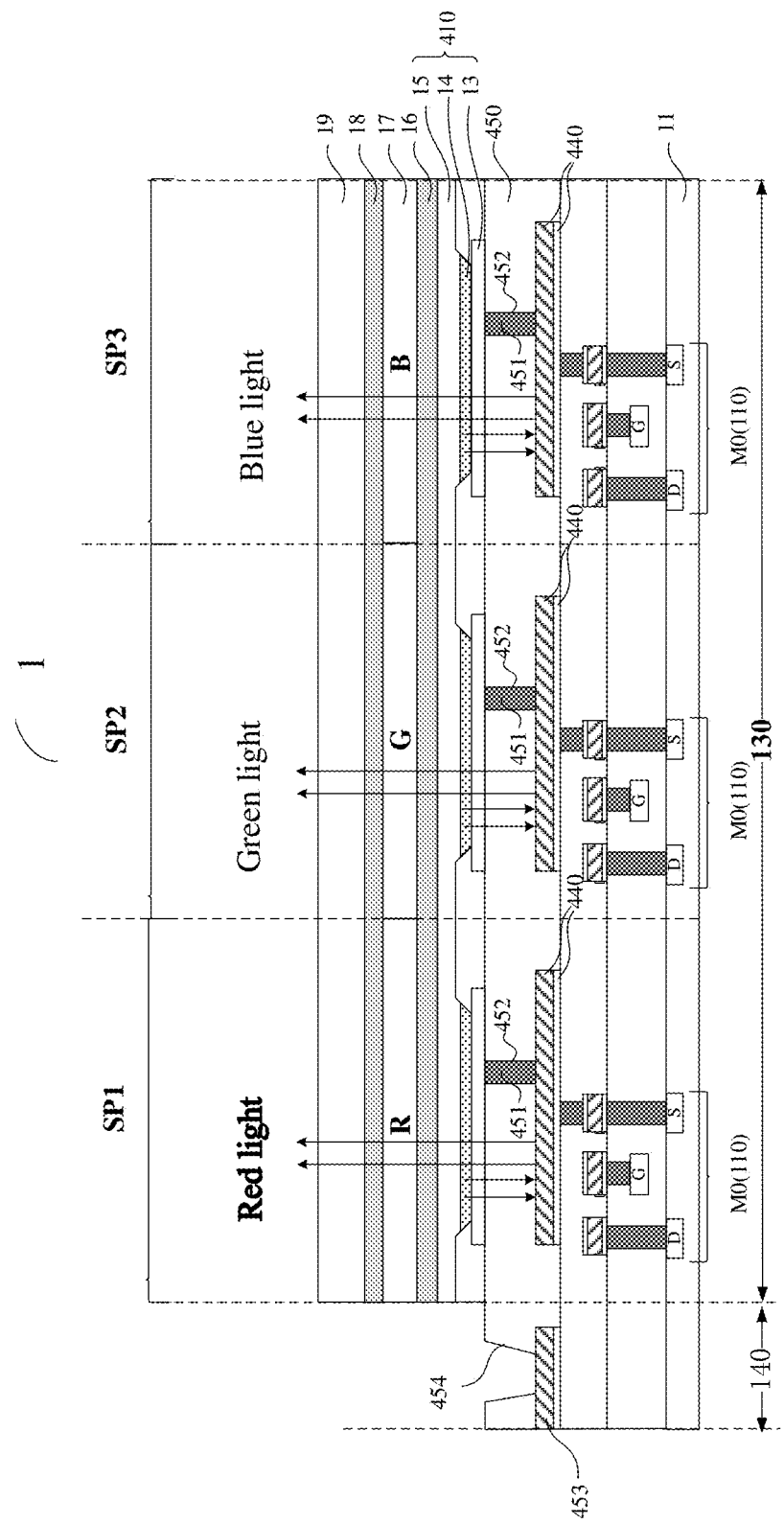
FIG. 5 is a schematic partial cross-sectional diagram of a display device provided by at least one embodiment of the present disclosure.

FIG. 5 is a schematic partial cross-sectional diagram of a display device provided by some embodiments of the present disclosure. In addition to showing the structure of the display device 1 in more detail and showing a plurality of sub-pixels, the display device 1 of this embodiment is basically the same as the display device 1 as shown in FIG. 1A. It should be understood that the display device 1 in this embodiment may be completely the same as or substantially the same as the display device 1 as shown in FIG. 1A. For the sake of concise description, the detailed structure of this display device 1 is not shown in FIG. 1A. Of course, the display device 1 in this embodiment may also be different from the display device 1 as shown in FIG. 1A, as long as the corresponding function can be achieved. It should be understood that the display device 1 as shown in FIG. 1A also includes a plurality of sub-pixels, and the sub-pixels are not shown in FIG. 1A for the sake of concise description.

In this embodiment, as shown in FIG. 5, the display device 1 includes a substrate 11 and a light-emitting element 410 (i.e., light-emitting element). For example, the substrate 11 includes a pixel circuit 110, and a light reflective layer 440 and an insulating layer 450 are sequentially stacked between the substrate 11 and the light-emitting element 410. The light-emitting element 410 includes an anode layer 13 (i.e., a first electrode layer of the light-emitting element), an organic light-emitting layer 14, and a cathode layer 15 (i.e., a second electrode layer of the light-emitting element) that are sequentially stacked on the insulating layer 450. The anode layer 13 is a transparent electrode layer. For example, the insulating layer 450 is a light-transmitting layer, so that the light emitted by the organic light-emitting layer 14 penetrates through the insulating layer 450, reaches the light reflective layer 440, and is reflected by the light reflective layer 440.

For example, the insulating layer 450 includes a via hole 452 filled with a metal member 451, and the light reflective layer 440 is electrically connected to the anode layer 13 through the metal member 451. In this way, by forming a conductive path between the light reflective layer 440 and the anode layer 13 in the insulating layer 450, it is advantageous to transmit the electrical signal provided by the pixel circuit 110 in the substrate 11 to the anode layer 13 through the light reflective layer 440. In this way, it not only facilitates the pixel circuit 110 to control the light-emitting element 410, but also enables the structure of the silicon-based organic light-emitting display panel more compact, which is beneficial to the miniaturization of the device. Further, for example, the metal member 451 is made of a metal material, such as tungsten metal, and a via hole filled with the tungsten metal is also called a tungsten via (W-via). For example, in the case where the thickness of the insulating layer 450 is large, forming the tungsten via in the insulating layer 450 can ensure the stability of the conductive path, and, because the process of making the tungsten via is mature, the obtained insulating layer 450 has a good surface flatness, which is beneficial to reduce the contact resistance between the insulating layer 450 and the anode layer 13. It can be understood that the tungsten via is not only suitable for achieving electrical connection between the insulating layer 450 and the anode layer 13, but also suitable for achieving electrical connection between the light reflective layer 440 and the pixel circuit 110, and for achieving electrical connection between other wiring layers, such as the layers where the electrodes of the driving transistor, the switching transistor and the capacitor, and the signal lines in the pixel circuit are located.

For example, the substrate 11 includes a pixel circuit 110, the pixel circuit 110 and the light reflective layer 440 are electrically connected to each other, and the pixel circuit 110 is used to drive the light-emitting element 410 to emit light. The pixel circuit 110 includes at least a driving transistor MO and a switching transistor (not shown), and the driving transistor MO is electrically connected to the light reflective layer 440. Thus, the electrical signal driving the light-emitting element 410 can be transmitted to the anode layer 13 through the light reflective layer 440, thereby controlling the light-emitting element 410 to emit light. For example, the driving transistor MO includes a gate electrode G, a source electrode S, and a drain electrode D. The source electrode S of the driving transistor MO is electrically connected to the light reflective layer 440. In the case where the driving transistor MO is in a turn-on state and is in a saturation state, under the control of the data voltage applied to the gate electrode, a driving current provided by a power supply line can be transmitted to the anode layer 13 through the source electrode S of the driving transistor MO and the light reflective layer 440. Because a voltage difference is formed between the anode layer 13 and the cathode layer 15, an electric field is formed between the anode layer 13 and the cathode layer 15, and holes and electrons are respectively injected into the organic light-emitting layer 14 and recombined, and therefore, the organic light-emitting layer 14 emits light under the action of the electric field. It can be understood that in the driving transistor MO, the positions of the source electrode S and the drain electrode D are interchangeable, and therefore, one of the source electrode S and the drain electrode D may be electrically connected to the light reflective layer 440.

For example, the display device 1 includes a plurality of sub-pixels (or pixel units), and three sub-pixels, that is, a red sub-pixel SP1, a green sub-pixel SP2, and a blue sub-pixel SP3, are exemplarily as shown in FIG. 5. Each sub-pixel corresponds to a sub-pixel area of the display device 1. That is, each sub-pixel is provided with an independent light-emitting element 410 and an independent driving transistor MO.

For example, the insulating layers 450 in the three sub-pixels are integrally formed to facilitate a manufacturing process. For example, as shown in FIG. 5, the insulating layer 450 further includes an opening 454 exposing the pad 453. The arrangement of the opening 454 facilitates electrical connection and signal communication between the pad 453 and external circuits. For example, the opening 454 exposing the pad 453 is located in the peripheral area 140. The colors of the sub-pixels in the display device 1 are only schematic, and may also include other colors such as yellow and white.

For example, as shown in FIG. 5, the display device 1 further includes a first thin film encapsulation layer 16, a color filter layer 17, and a second thin film encapsulation layer 18 that are sequentially disposed on the cathode layer 15. The display device 1 further includes a cover plate 19, and the cover plate 19 is disposed on the second thin film encapsulation layer 18. For example, the first thin film encapsulation layer 16 is located on the side of the cathode layer 15 away from the substrate 11. The color filter layer 17 is located on a side of the first thin film encapsulation layer 16 away from the substrate 11 and includes a red color filter unit R, a green color filter unit G, and a blue color filter unit B. The second thin film encapsulation layer 18 and the cover plate 19 are located on a side of the color filter layer 17 away from the substrate 11. The specific materials of the first thin film encapsulation layer 16, the color filter layer 17, the second thin film encapsulation layer 18, and the cover plate 19 can adopt materials in the art, and will not be described in detail here.

For example, in the display device 1 provided by the embodiment of the present disclosure, the light-emitting element 410 including the anode layer 13, the organic light-emitting layer 14, and the cathode layer 15 as well as the first thin film encapsulation layer 16, the color filter layer 17, the second thin film encapsulation layer 18, and the cover plate 19 can be manufactured separately on the separately prepared substrate 11, in addition, in the same process, the insulating layer 450 above the pad 453 may also be etched to expose the pad 453 and enable the pad 453 to be bonded to a flexible printed circuit board (FPC) or a wire (Wire). Therefore, in the embodiments of the present disclosure, for example, the substrate 11 including the light reflective layer 440 and the insulating layer 450 and suitable for forming the light-emitting element 430 may be manufactured by a wafer factory, and then the structures on the substrate 11 are prepared in a display panel factory, which not only reduces the difficulty of manufacturing the light reflective layer 440, but also facilitates the subsequent process in the display panel factory.

Figure 6:
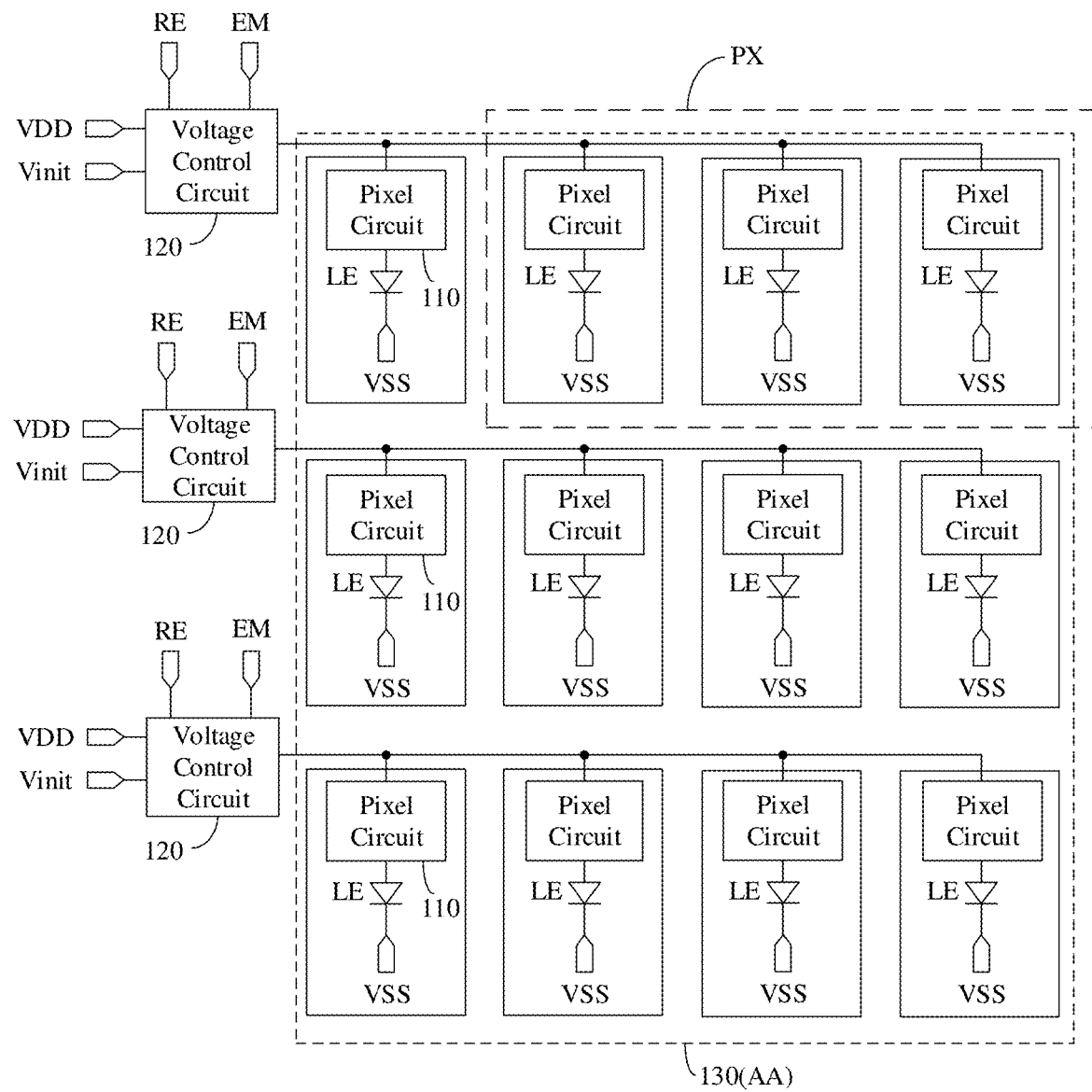
FIG. 6 is a schematic diagram of a circuit principle of a display device provided by at least one embodiment of the present disclosure.

FIG. 6 is a schematic diagram of a circuit principle of a display device provided by some embodiments of the present disclosure. The display device 1 includes a plurality of light-emitting elements LE located in the display area 130 (AA area) as shown in FIG. 5 and pixel circuits 110 coupled to the respective light-emitting elements LE in a one-to-one correspondence manner. The pixel circuit 110 includes a driving transistor. Moreover, the display device 1 may further include a plurality of voltage control circuits 120 located in the peripheral area 140 outside the display area 130 of the display device 1. For example, at least two pixel circuits 110 in a row share one voltage control circuit 120, and first electrodes of the driving transistors in the pixel circuits 110 in one row are coupled to the shared voltage control circuit 120, and respective second electrodes of the driving transistor are coupled to the corresponding light-emitting elements LE. The voltage control circuit 120 is configured to output an initialization signal Vinit to the first electrode of the driving transistor and control the corresponding light-emitting element LE to reset in response to a reset control signal RE; and output a first power signal VDD to the first electrode of the driving transistor in response to a light-emitting control signal EM, so as to drive the light-emitting element LE to emit light. By sharing the voltage control circuit 120, the structure of each pixel circuit in the display area 130 can be simplified, and the occupied area of the pixel circuits in the display area 130 can be reduced, so that more pixel circuits and light-emitting elements can be provided in the display area 130 to achieve a high-PPI organic light-emitting display panel. Furthermore, the voltage control circuit 120 outputs the initialization signal Vinit to the first electrode of the driving transistor under the control of the reset control signal RE, and controls the corresponding light-emitting element to reset, thereby avoiding the influence of the voltage applied to the light-emitting element during a light-emitting process in a previous frame on a light-emitting process in a next frame, and further ameliorating the afterimage phenomenon.

For example, the display device 1 may further include a plurality of pixel units PX located in the display area 130, and each pixel unit PX includes a plurality of sub-pixels, and each sub-pixel includes a light-emitting element LE and a pixel circuit 110. Further, the pixel unit PX may include three sub-pixels of different colors. The three sub-pixels may be a red sub-pixel, a green sub-pixel, and a blue sub-pixel. Of course, the pixel unit PX may also include 4, 5, or more sub-pixels, which need to be designed and determined according to the actual application environment, and the embodiments of the present disclosure are not limited to this case.

For example, the pixel circuits 110 in at least two adjacent sub-pixels in the same row may share one voltage control circuit 120. For example, in some examples, as shown in FIG. 6, all pixel circuits 110 in the same row may share one voltage control circuit 120. Alternatively, in other examples, the pixel circuits 110 in adjacent two, three, or more sub-pixels in the same row may share one voltage control circuit 120, and the embodiments of the present disclosure are not limited to this case. In this way, by sharing the voltage control circuit 120, the occupied area of the pixel circuit in the display area 130 can be reduced.

Figure 7:
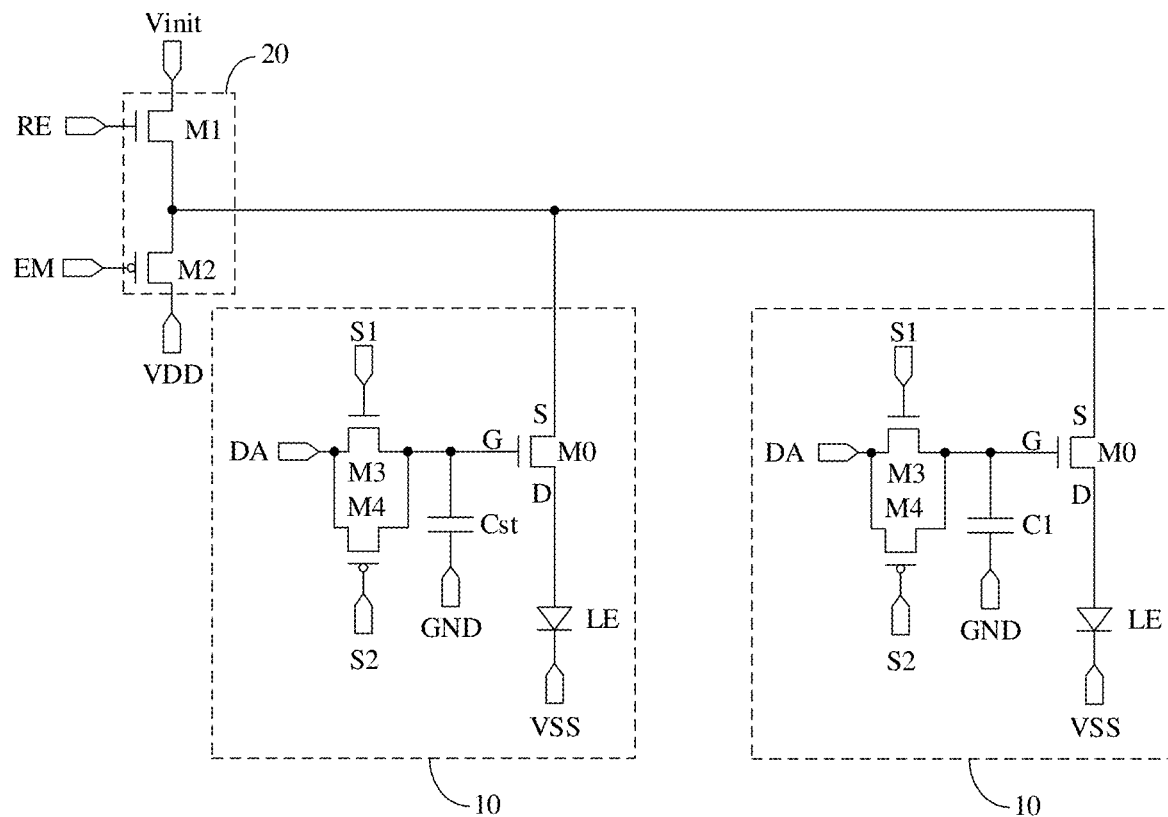
FIG. 7 is a circuit diagram of a specific implementation example of a voltage control circuit and a pixel circuit of a display device provided by at least one embodiment of the present disclosure.

FIG. 7 is a circuit diagram of a specific implementation example of a voltage control circuit and a pixel circuit of a display device 1 provided by some embodiments of the present disclosure. For example, the driving transistor M0 in the pixel circuit 110 may be an N-type transistor. And, the light-emitting element LE may include OLED. In this way, the anode of the OLED is electrically connected to a second terminal D of the driving transistor M0, and the cathode of the OLED is electrically connected to a second power terminal VSS. The voltage of the second power terminal VSS is generally a negative voltage or a ground voltage VGND (generally 0V), and the voltage of the initialization signal Vinit may also be set to be the ground voltage VGND, and the embodiments of the present disclosure are not limited thereto. For example, the OLED can be set to be Micro-OLED or Mini-OLED, which is further conducive to achieving a high PPI organic light-emitting display panel.

For example, taking two pixel circuits 110 included in one row as an example, the voltage control circuit 120 may include a first switching transistor M1 and a second switching transistor M2. A gate electrode of the first switching transistor M1 is used to receive a reset control signal RE, a first electrode of the first switching transistor M1 is used to receive the initialization signal Vinit, and a second electrode of the first switching transistor M1 is coupled to the first electrode S of the corresponding driving transistor M0. A gate electrode of the second switching transistor M2 is used to receive a light-emitting control signal EM, a first electrode of the second switching transistor M2 is used to receive the first power signal VDD, and a second electrode of the second switching transistor M2 is coupled to the first electrode S of the corresponding driving transistor M0.

For example, the types of the first switching transistor M1 and the second switching transistor M2 may be different. For example, the first switching transistor M1 is an N-type transistor, and the second switching transistor M2 is a P-type transistor. Alternatively, the first switching transistor M1 is a P-type transistor, and the second switching transistor M2 is an N-type transistor. Of course, the types of the first switching transistor M1 and the second switching transistor M2 may be the same. In practical applications, the types of the first switching transistor M1 and the second switching transistor M2 need to be designed according to the actual application environment, and are not limited herein.

For example, the pixel circuit 110 may further include a third switching transistor M3 and a storage capacitor Cst. For example, a gate electrode of the third switching transistor M3 is used to receive a first gate scan signal S1, a first electrode of the third switching transistor M3 is used to receive a data signal DA, and a second electrode of the third switching transistor M3 is coupled to the gate electrode G of the driving transistor M0. A first terminal of the storage capacitor Cst is coupled to the gate electrode G of the driving transistor M0, and a second terminal of the storage capacitor Cst is coupled to a ground terminal GND.

For example, the pixel circuit 110 may further include a fourth switching transistor M4. For example, a gate electrode of the fourth switching transistor M4 is used to receive a second gate scan signal S2, a first electrode of the fourth switching transistor M4 is used to receive the data signal DA, and a second electrode of the fourth switching transistor M4 is coupled to the gate electrode G of the driving transistor M0. Also, the types of the fourth switching transistor M4 and the third switching transistor M3 are different. For example, the third switching transistor M3 is an N-type transistor, and the fourth switching transistor M4 is a P-type transistor; or, the third switching transistor M3 is a P-type transistor, and the fourth switching transistor M4 is an N-type transistor.

It should be noted that in the case where the voltage of the data signal DA is a voltage corresponding to a high grayscale, the data signal DA is transmitted to the gate electrode G of the driving transistor M0 by, for example, turning on the P-type fourth switching transistor M4, to prevent the voltage of the data signal DA from being affected by the threshold voltage of the N-type third switching transistor M3, for example. In the case where the voltage of the data signal DA is a voltage corresponding to a low grayscale, the data signal DA is transmitted to the gate electrode G of the driving transistor M0 by, for example, turning on the N-type third switching transistor M3, so as to prevent the voltage of the data signal DA from being affected by the threshold voltage of the P-type fourth switching transistor M4, for example. This can increase a voltage range input to the gate electrode G of the driving transistor M0.

The driving transistor M0, the first switching transistor M1, the second switching transistor M2, the third switching transistor M3, and the fourth switching transistor M4 are MOS transistors manufactured in a silicon substrate.

It should be noted that, for clarity and conciseness, the embodiments of the present disclosure do not provide all constituent components of the display device. In order to achieve the basic functions of the display device, those skilled in the art may provide and set other structures not shown according to specific needs, and the embodiments of the present disclosure are not limited thereto.

In at least one embodiment of the present disclosure, the display device can avoid the color deviation problem generated under the application of a larger viewing angle while having a high PPI, improve the display quality of the display device, and thereby improving the user experience. In other embodiments, in the case of expanding the color deviation prevention viewing angle of the display device, the first distance H may be correspondingly reduced by the above formula (1) to avoid the problem of color deviation at the expanded color deviation prevention viewing angle, thereby solving the color mixing problem of the display device under the application of large viewing angle.

Figure 8:
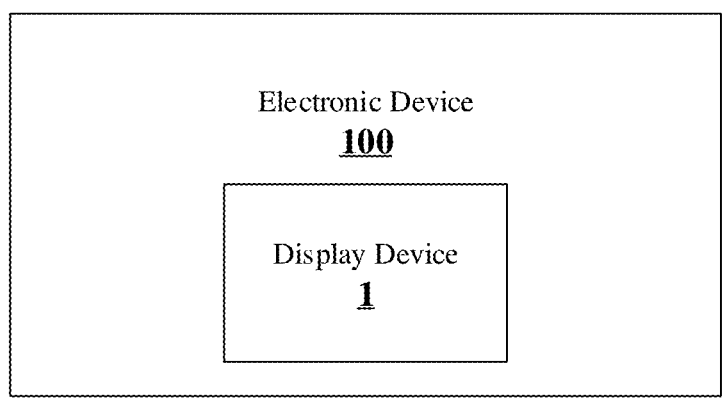
FIG. 8 is a schematic diagram of an electronic equipment provided by at least one embodiment of the present disclosure.

At least one embodiment of the present disclosure also provides an electronic equipment. FIG. 8 is a schematic diagram of an electronic equipment provided by at least one embodiment of the present disclosure.

As shown in FIG. 8, the electronic equipment 100 includes the display device 1 provided by any embodiment of the present disclosure, for example, the display device 1 as shown in FIG. 1A or FIG. 5. For example, the display device 1 may be a virtual reality device or an augmented reality device.

For example, the display device 1 may be a silicon-based OLED display device, and the embodiments of the present disclosure are not limited to this case.

It should be noted that, for clarity and conciseness, the embodiments of the present disclosure do not provide all constituent units of the electronic equipment 100. In order to achieve the basic functions of the electronic equipment 100, those skilled in the art may provide and set other structures not shown according to specific needs, and the embodiments of the present disclosure are not limited thereto.

For the technical effect of the electronic equipment 100 provided by the above embodiment, reference may be made to the technical effect of the display device provided in the embodiment of the present disclosure, and will not be repeated here.

Figure 9:
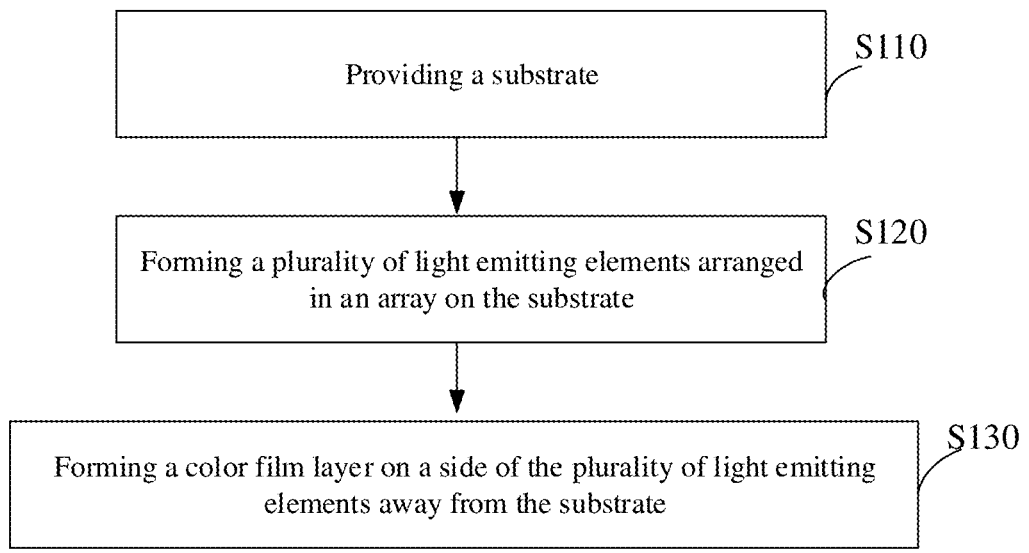
FIG. 9 is a flowchart of a manufacture method for manufacturing a display device provided by at least one embodiment of the present disclosure.

At least one embodiment of the present disclosure also provides a manufacture method for manufacturing a display device. FIG. 9 is a flowchart of a manufacture method for manufacturing a display device provided by at least one embodiment of the present disclosure. For example, the manufacture method can be used to manufacture the display device provided by any embodiment of the present disclosure. For example, the manufacture method can be used to manufacture the display substrate as shown in FIG. 1A. As shown in FIG. 9, the manufacture method for manufacturing the display device includes steps S110 to S130.

Step S110: providing a substrate.

Step S120: forming a plurality of light-emitting elements arranged in an array on the substrate.

Step S130: forming a color filter layer on a side of the plurality of light-emitting elements away from the substrate.

For step S110, for example, the substrate 11 is a silicon-based base substrate, such as a silicon-based base substrate (OLED silicon-based base substrate) used in an organic light-emitting diode (OELD) display device. For example, the substrate 11 functions as support, protection, etc. The substrate 11 may be a single crystal silicon-based base substrate or a silicon-on-insulator (SOI) base substrate. For example, the substrate 11 may further include any suitable components, such as a thin film encapsulation layer, a light extraction layer, and a cover plate, disposed on the substrate 11 to achieve the display function. For example, any suitable circuit components, such as a gate drive circuit, a data drive circuit, and a pixel circuit (not shown in the figure), are integrated on the substrate 11, and these circuit components are prepared by, for example, a silicon semiconductor process (for example, a CMOS process), and the embodiments of the present disclosure are not limited thereto. For example, the pixel circuits are configured to respectively drive the plurality of light-emitting elements to emit light. For example, the pixel circuit may be a general 2T1C pixel circuit, a general 4T1C pixel circuit, and may also be a pixel circuit having functions such as internal compensation or external compensation, which is not limited in the embodiments of the present disclosure. For example, the gate drive circuit (not shown) is used to generate a gate drive signal, and the data drive circuit (not shown) is used to generate a data signal. The gate drive circuit and the data drive circuit can adopt conventional circuit structures in the art, and the embodiments of the present disclosure are not limited to this case.

For step S120, for example, the plurality of light-emitting elements 410 arranged in an array are located on the substrate 11. For example, as shown in FIG. 1A, the plurality of light-emitting elements 410 include a first light-emitting element 411 and a second light-emitting element 412 adjacent to the first light-emitting element 411 in the first direction X parallel to the surface of the substrate. For example, the first direction X is a row direction or a column direction, which is not limited in the embodiments of the present disclosure.

For step S130, for example, as shown in FIG. 1A or FIG. 2A, the color filter layer 17 includes a plurality of color filter units, such as the red color filter unit R, the green color filter unit G, and the blue color filter unit B, and the plurality of color filter units are in one-to-one correspondence with the plurality of light-emitting elements 410 and are on a side of the plurality of light-emitting elements 410 away from the substrate 11.

For example, as shown in FIG. 1A, the display device further includes a first thin film encapsulation layer 16, and a color filter layer 17 disposed on the first thin film encapsulation layer 16 and corresponding to the organic light-emitting layer 14, so that the colorized display of the emitted light can be achieved. Of course, the embodiments of the present disclosure are not limited thereto, and the color filter layer 17 may also include color filter units of other colors, such as white, yellow, and the like.

For example, as shown in FIG. 2A, in the direction Y perpendicular to the substrate 11, there is a first distance H between the plurality of light-emitting elements 410 and the color filter layer 17. For example, the display device 1 has a color deviation prevention viewing angle θ and a color deviation prevention distance D on a reference plane determined by the first direction X and a second direction Y perpendicular to the surface of the substrate 11. For example, the color deviation prevention viewing angle θ is, along a cross-section by the reference plane determined by the first direction X and the second direction Y, an angle between a connection line L1 and the direction Y (i.e., a straight line L2 shown in FIG. 2A) perpendicular to the substrate, the connection line L1 connects a side of the first light-emitting element 411 close to the second light-emitting element 412 and a side of a color filter unit B, which corresponds to the second light-emitting element 412, close to the first light-emitting element 411. For example, the color deviation prevention distance D is, along the cross-section by the reference plane, a distance between a projection G of the first light-emitting element 411 on the color filter layer and the color filter unit B corresponding to the second light-emitting element 412. For example, the first distance H is configured to enable the color deviation prevention viewing angle θ to be greater than a preset angle, so that the problem of color deviation generated under a large viewing angle can be avoided while achieving high PPI, thereby improving the display quality of the display device.

For example, the first distance H between the plurality of light-emitting elements 410 and the color filter layer 17 ranges from 0.02 microns to 15 microns, the color deviation prevention distance D ranges from 0.1 micron to 15 microns, and the preset angle ranges from 30° to 80°. For example, in some examples, the preset angle ranges from 40° to 50°. For example, in some examples, in the case where the color deviation prevention distance D is determined to be 0.1 μm according to the needs of the aperture ratio and the like, and the color deviation prevention viewing angle is increased to about 78° as needed, the first distance H can be reduced to 0.02 μm, so as to ensure that the display device does not exhibit color mixing under the color deviation prevention viewing angle (for example, if the first distance H is higher than 0.02 µm, the color mixing will occur), thereby achieving the above-mentioned color deviation prevention viewing angle and solving the color mixing problem of the display device under the application of large viewing angle. The embodiments of the present disclosure are not limited to this case.

For example, in at least one embodiment of the present disclosure, the first distance between the plurality of light-emitting elements and the color filter layer, the color deviation prevention viewing angle, and the color deviation prevention distance satisfy the following relationship:

$$H=D/\tan \theta \qquad (1)$$

where H represents the first distance, θ represents the color deviation prevention viewing angle, and D represents the color deviation prevention distance.

For example, after determining the color deviation prevention viewing angle θ and the color deviation prevention distance D, the first distance H between the plurality of light-emitting elements and the color filter layer can be determined by the above formula (1). Therefore, at the first distance H, the light emitted by the first light-emitting element 411 will not pass through the color filter unit B corresponding to the second light-emitting element 412 under a specific color deviation prevention viewing angle, but only passes through the color filter unit G corresponding to the first light-emitting element 411, that is, under this color deviation prevention viewing angle, the display device 1 displays, for example, only green, but not blue, thereby effectively solving the color deviation problem, avoiding color mixing under the viewing angle, and improving the display quality of the display device. Moreover, under the condition of satisfying a certain aperture ratio, the color deviation prevention viewing angle of the display device can be expanded, and the first distance H corresponding to the expanded color deviation prevention viewing angle can be determined by the above formula (1), which can solve the problem of color deviation that occurs under a specific color deviation prevention viewing angle.

Figure 3:
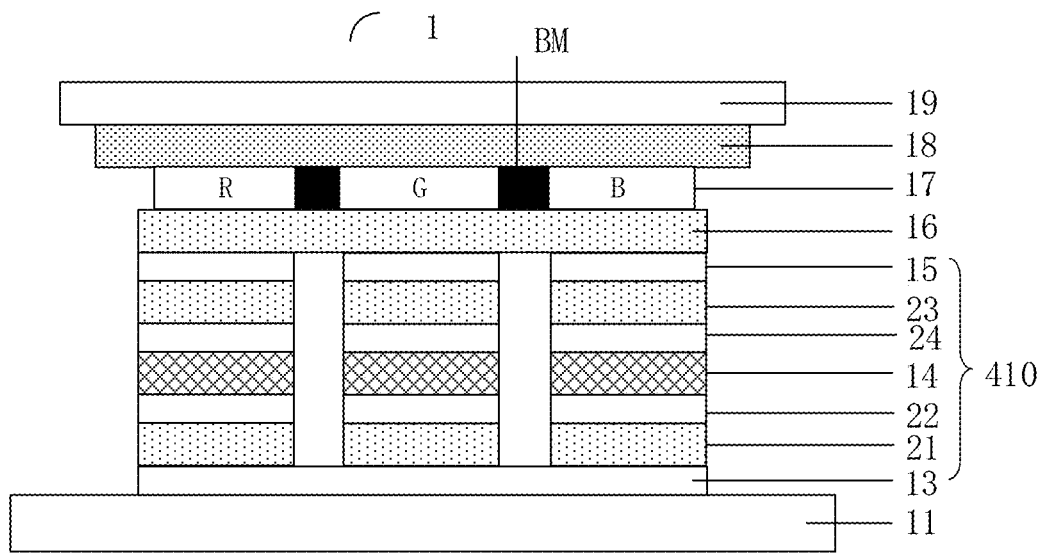
FIG. 3 is a schematic cross-sectional view of still another display device provided by at least one embodiment of the present disclosure.

For example, in some examples, as shown in FIG. 3, the manufacture method further includes: sequentially forming a first electrode layer 13 on the substrate 11; forming a hole injection layer 21 between the first electrode layer 13 and the color filter layer 17; forming a hole transport layer 22 between the hole injection layer 21 and the color filter layer 17; forming an organic light-emitting layer 14 between the hole injection layer 21 and the color filter layer 17; forming an electron transport layer 24 between the organic light-emitting layer 14 and the color filter layer 17; forming an electron injection layer 23 between the electron transport layer 24 and the color filter layer 17; and forming a second electrode layer 15 between the electron injection layer 23 and the color filter layer 17. A detailed introduction can refer to the related description in FIG. 3 above, and will not be repeated here.

For example, in this example, the first distance H between the plurality of light-emitting elements 410 and the color filter layer 17 is a distance between the surface of the second electrode layer 15 away from the substrate 11 (i.e., the upper surface of the second electrode layer 15) and the surface of the corresponding color filter unit of the color filter layer 17 facing the substrate 11 (i.e., the lower surface of the color filter layer 17). For example, in this example, the vertex of the color deviation prevention viewing angle is on the surface of the second electrode layer 15 away from the substrate 11 (i.e., the upper surface of the second electrode layer 15). That is, the light-emitting element 420 shown in FIGS. 2A and 2B is the surface of the second electrode layer 15 away from the substrate 11 (that is, the upper surface of the second electrode layer 15), and the color filter layer 17 as shown in FIGS. 2A and 2B is the surface of the color filter unit of the color filter layer 17 facing the substrate 11 (that is, the lower surface of the color filter layer 17).

For example, in some examples, the manufacture method further includes forming a black matrix BM between adjacent color filter units. For example, in the example shown in FIG. 2A, the color deviation prevention distance D is equal to a width of the black matrix BM in the first direction X. For example, in this example, the width of the black matrix BM in the first direction X is equal to the distance L between adjacent light-emitting elements in the first direction X, for example, the distance L between the first light-emitting element 411 and the second light-emitting element 412. That is, in this example, the width of the light-emitting element 410 and the width of the color filter unit in the first direction X are equal, and the distance between the light-emitting elements and the distance between the color filter units are equal, that is, the first distance D is equal to the distance L between the respective light-emitting elements. For example, the distance L between the respective light-emitting elements is determined according to the resolution of the display device and the size of the display panel. For a specific determination method, reference may be made to a method in the art, and the specific determination method will not be repeated here.

It should be noted that the width of the black matrix BM in the first direction X may also not be equal to the distance L between adjacent light-emitting elements in the first direction X, for example, the width of the black matrix BM in the first direction X may be larger or smaller than the distance L between adjacent light-emitting elements in the first direction X, which is not limited in the embodiments of the present disclosure.

For example, in some examples, as shown in FIG. 4B, the manufacture method further includes: forming a first thin film encapsulation layer 16 between the plurality of light-emitting elements 410 and the color filter layer 17; forming a light coupling-output layer 20 between the first thin film encapsulation layer 16 and the plurality of light-emitting elements 410; and forming a second thin film encapsulation layer 18 on a side of the color filter layer 17 away from the substrate 11.

For example, in the case where only the first thin film encapsulation layer 16 is included between the plurality of light-emitting elements 410 and the color filter layer 17, the first distance H is the thickness of the first thin film encapsulation layer 16. For example, in the case where only the first thin film encapsulation layer 16 is included between the plurality of light-emitting elements 410 and the color filter layer 17, the first distance H is the thickness of the first thin film encapsulation layer 16.

For example, in some example, the manufacture method further includes forming a cover plate 19 on the second thin film encapsulation layer. For example, the cover plate 19 is disposed opposite to the substrate 10, the cover plate 19 is attached to the second thin film encapsulation layer 18, for example, to achieve the functions of protection, improving strength, and the like. For example, the cover plate 19 and the substrate 10 are parallel to each other. For example, the material of the cover plate 19 is a transparent material. For example, the transparent material may be an inorganic material such as glass or an organic material such as polyimide. For example, in some examples, the cover plate 19 may be made of high-transmittance plain glass, and the embodiments of the present disclosure are not limited thereto.

For example, as shown in FIG. 1A, the second thin film encapsulation layer 18 and the cover plate 19 are sequentially disposed on the color filter layer 17, thereby achieving the function of protecting the color filter layer 17. For example, the first thin film encapsulation layer 16 and the second thin film encapsulation layer 18 are made of a combination of one or more of organic materials or inorganic materials with good sealing characteristics, so as to achieve a good sealing effect and protect the light-emitting element 410. For example, either the first thin film encapsulation layer 16 or the second thin film encapsulation layer 18 may be a composite film layer, and the composite film layer includes one or more organic sub-film layers or inorganic sub-film layers.

It should be noted that in various embodiments of the present disclosure, the flow of the manufacture method for manufacturing the display device may include more or fewer operations, and these operations may be performed sequentially or in parallel. Although the flow of the manufacture method described above includes a plurality of operations in a specific order, but it should be clearly understood that the order of the plurality of operations is not limited. The manufacture method described above can be performed once or several times according to predetermined conditions.

For the technical effect of the manufacture method for manufacturing the display device provided by the above embodiment, reference may be made to the technical effect of the display device provided by the embodiment of the present disclosure, and similar portions will not be repeated here.

The following statements should be noted:

(1) The accompanying drawings involve only the structure(s) in connection with the embodiment(s) of the present disclosure, and other structure(s) can be referred to common design(s).

(2) In case of no conflict, the embodiments of the present disclosure and the features in the embodiments can be combined with each other to obtain new embodiments.

What have been described above are only exemplary embodiments of the present disclosure and are not intended to limit the scope of protection of the present disclosure, and the scope of protection of the present disclosure is determined by the appended claims.

What is claimed is:

1. A display device, comprising:
a substrate, comprising a display area and a peripheral area surrounding the display area;
a plurality of light-emitting elements arranged in an array on the substrate, wherein the plurality of light-emitting elements comprise a first light-emitting element and a second light-emitting element adjacent to the first light-emitting element in a first direction parallel to a surface of the substrate; and
a color filter layer, which is on the substrate and comprises a plurality of color filter units, wherein in the display area, the plurality of color filter units are in one-to-one correspondence with the plurality of light-emitting elements and are on a side of the plurality of light-emitting elements away from the substrate;
wherein in a second direction perpendicular to the surface of the substrate, a distance between the plurality of light-emitting elements and the color filter layer is a first distance;
the display device has a color deviation prevention viewing angle on a reference plane determined by the first direction and the second direction perpendicular to the surface of the substrate;
the color deviation prevention viewing angle is, along a cross-section by the reference plane, an angle between a connection line and the second direction perpendicular to the surface of the substrate, the connection line connects a side of the first light-emitting element close to the second light-emitting element and a side of a color filter unit, which corresponds to the second light-emitting element, close to the first light-emitting element; and
the first distance is configured to enable the color deviation prevention viewing angle to be greater than a preset angle,
the display device further comprises: a first thin film encapsulation layer, provided between the plurality of light-emitting elements and the color filter layer, wherein the first distance comprises a thickness of the first thin film encapsulation layer,
the display device further comprises a second thin film encapsulation layer, on a side of the color filter layer away from the substrate, wherein the first thin film encapsulation layer comprises:
a first inorganic encapsulation layer, on the side of the light-emitting elements away from the substrate;
a second inorganic encapsulation layer, on a side of the first inorganic encapsulation layer away from the substrate; and
a first organic encapsulation layer, on a side of the second inorganic encapsulation layer away from the substrate,
wherein a refractive index of the first inorganic encapsulation layer is greater than a refractive index of the second inorganic encapsulation layer,
the display device further comprises a color deviation prevention distance on the reference plane determined by the first direction and the second direction perpendicular to the surface of the substrate,
wherein the color deviation prevention distance is, along the cross-section by the reference plane, a minimum distance between an edge of a projection of a light-emitting area of the first light-emitting element on the color filter layer and the color filter unit corresponding to the second light-emitting element,
the color deviation prevention distance ranges from 0.1 micron to 15 microns, the first distance between the plurality of light-emitting elements and the color filter layer ranges from 0.02 microns to 15 microns, and the preset angle ranges from 30° to 80°,
the display device further comprises a black matrix between adjacent color filter units of the plurality of color filter units, and the color deviation prevention distance is equal to a width of the black matrix in the first direction.

2. The display device according to claim 1, wherein the first distance between the plurality of light-emitting elements and the color filter layer, the color deviation prevention viewing angle, and the color deviation prevention distance satisfy a following relationship:

$$H = D/\tan \theta$$

where H represents the first distance, θ represents the color deviation prevention viewing angle, and D represents the color deviation prevention distance.

3. The display device according to claim 1, wherein each of the plurality of light-emitting elements comprises:

a first electrode layer on the substrate;
an organic light-emitting layer, on a side of the first electrode layer away from the substrate;
a second electrode layer, on a side of the organic light-emitting layer away from the first electrode layer,
wherein the first distance between each of the plurality of light-emitting elements and the color filter layer is a distance between a surface of the second electrode layer away from the substrate and a surface of a corresponding color filter unit of the color filter layer facing the substrate; and
the color deviation prevention viewing angle is, along the cross-section by the reference plane, an angle between the connection line and the second direction perpendicular to the surface of the substrate, and the connection line connects a side of the second electrode layer of the first light-emitting element close to the second light-emitting element and the side of the color filter unit, which corresponds to the second light-emitting element, close to the first light-emitting element.

4. The display device according to claim 1, wherein the width of the black matrix in the first direction is equal to a distance between adjacent light-emitting elements in the first direction.

5. The display device according to claim 1, wherein any two adjacent color filter units in the second direction partially overlap, and the black matrix is a portion where the any two adjacent color filter units overlap.

6. The display device according to claim 1, wherein projections of the plurality of color filter units on a plane where the substrate is located are continuous in the first direction and do not overlap in the second direction.

7. The display device according to claim 6, wherein the color deviation prevention distance is equal to half of a distance between adjacent light-emitting elements in the first direction.

8. The display device according to claim 1, wherein the substrate is a silicon-based base substrate, the silicon-based base substrate comprises pixel circuits, and the pixel circuits are connected to first electrode layers of the plurality of light-emitting elements through tungsten materials filled in via holes on the substrate and are configured to drive the first electrode layers of the plurality of light-emitting elements, respectively.

9. The display device according to claim 1, wherein the plurality of light-emitting elements are configured to emit white light,
each light-emitting element comprises a plurality of light-emitting layers stacked in sequence on the substrate, and the plurality of light-emitting layers emit light of different primary colors; or, each light-emitting element comprises a light-emitting layer, and the light-emitting layer is doped with various dopants for emitting light of different primary colors.

10. The display device according to claim 1,
wherein the first distance comprises a thickness of the first thin film encapsulation layer.

11. The display device according to claim 10, further comprising:
an optical coupling-output layer, provided between the first thin film encapsulation layer and the plurality of light-emitting elements,
wherein the first distance comprises the thickness of the first thin film encapsulation layer and a thickness of the optical coupling-output layer.

12. An electronic equipment, comprising the display device according to claim 1.

13. A manufacture method for manufacturing a display device, comprising:
providing a substrate;
forming a plurality of light-emitting elements arranged in an array on the substrate, wherein the plurality of light-emitting elements comprise a first light-emitting element and a second light-emitting element adjacent to the first light-emitting element in a first direction parallel to a surface of the substrate; and
forming a color filter layer on a side of the plurality of light-emitting elements away from the substrate, wherein the color filter layer comprises a plurality of color filter units, and the plurality of color filter units are in one-to-one correspondence with the plurality of light-emitting elements;
wherein in a second direction perpendicular to the surface of the substrate, a distance between the plurality of light-emitting elements and the color filter layer is a first distance;
the display device has a color deviation prevention viewing angle on a reference plane determined by the first direction and the second direction perpendicular to the surface of the substrate;
the color deviation prevention viewing angle is, along a cross-section by the reference plane, an angle between a connection line and the second direction perpendicular to the surface of the substrate, the connection line connects a side of the first light-emitting element close to the second light-emitting element and a side of a color filter unit, which corresponds to the second light-emitting element, close to the first light-emitting element; and
the first distance is configured to enable the color deviation prevention viewing angle to be greater than a preset angle,
the manufacture method further comprises: forming a first thin film encapsulation layer, between the plurality of light-emitting elements and the color filter layer, wherein the first distance comprises a thickness of the first thin film encapsulation layer,
the manufacture method further comprises forming a second thin film encapsulation layer, on a side of the color filter layer away from the substrate, wherein the first thin film encapsulation layer comprises:
a first inorganic encapsulation layer, on the side of the light-emitting elements away from the substrate;
a second inorganic encapsulation layer, on a side of the first inorganic encapsulation layer away from the substrate; and
a first organic encapsulation layer, on a side of the second inorganic encapsulation layer away from the substrate,
wherein a refractive index of the first inorganic encapsulation layer is greater than a refractive index of the second inorganic encapsulation layer,
the display device further comprises a color deviation prevention distance on the reference plane determined by the first direction and the second direction perpendicular to the surface of the substrate,
wherein the color deviation prevention distance is, along the cross-section by the reference plane, a minimum distance between an edge of a projection of a light-emitting area of the first light-emitting element on the color filter layer and the color filter unit corresponding to the second light-emitting element,
the color deviation prevention distance ranges from 0.1 micron to 15 microns, the first distance between the plurality of light-emitting elements and the color filter layer ranges from 0.02 microns to 15 microns, and the preset angle ranges from 30° to 80°, the display device further comprises a black matrix between adjacent color filter units of the plurality of color filter units, and the color deviation prevention distance is equal to a width of the black matrix in the first direction.

14. A display device, comprising:

a substrate, comprising a display area and a peripheral area surrounding the display area;

a plurality of light-emitting elements arranged in an array on the substrate, wherein the plurality of light-emitting elements comprise a first light-emitting element and a second light-emitting element adjacent to the first light-emitting element in a first direction parallel to a surface of the substrate; and a color filter layer, which is on the substrate and comprises a plurality of color filter units, wherein in the display area, the plurality of color filter units are in one-to-one correspondence with the plurality of light-emitting elements and are on a side of the plurality of light-emitting elements away from the substrate;

wherein in a second direction perpendicular to the surface of the substrate, a distance between the plurality of light-emitting elements and the color filter layer is a first distance;

the display device has a color deviation prevention viewing angle on a reference plane determined by the first direction and the second direction perpendicular to the surface of the substrate;

the color deviation prevention viewing angle is, along a cross-section by the reference plane, an angle between a connection line and the second direction perpendicular to the surface of the substrate, the connection line connects a side of the first light-emitting element close to the second light-emitting element and a side of a color filter unit, which corresponds to the second light-emitting element, close to the first light-emitting element; and the first distance is configured to enable the color deviation prevention viewing angle to be greater than a preset angle, the display device further comprises: a first thin film encapsulation layer, provided between the plurality of light-emitting elements and the color filter layer, wherein the first distance comprises a thickness of the first thin film encapsulation layer, the display device further comprises a second thin film encapsulation layer, on a side of the color filter layer away from the substrate, wherein the first thin film encapsulation layer comprises:

a first inorganic encapsulation layer, on the side of the light-emitting elements away from the substrate;

a second inorganic encapsulation layer, on a side of the first inorganic encapsulation layer away from the substrate; and a first organic encapsulation layer, on a side of the second inorganic encapsulation layer away from the substrate, wherein a refractive index of the first inorganic encapsulation layer is greater than a refractive index of the second inorganic encapsulation layer, wherein the second thin film encapsulation layer comprises:

a second organic encapsulation layer, on the side of the color filter layer away from the substrate; and a third inorganic encapsulation layer, on a side of the second organic encapsulation layer away from the substrate, wherein a refractive index of the first organic encapsulation layer and a refractive index of the second organic encapsulation layer are substantially identical, and the refractive index of the second organic encapsulation layer is greater than a refractive index of the third inorganic encapsulation layer.

\* \* \* \* \*